(12) United States Patent
Sagimori et al.

(10) Patent No.: US 7,541,620 B2
(45) Date of Patent: Jun. 2, 2009

(54) SEMICONDUCTOR DEVICE, LIGHT EMITTING DIODE PRINT HEAD, AND IMAGE FORMING APPARATUS

(75) Inventors: Tomohiko Sagimori, Tokyo (JP); Mitsuhiko Ogihara, Tokyo (JP); Hiroyuki Fujiwara, Tokyo (JP); Masataka Muto, Tokyo (JP)

(73) Assignee: Oki Data Corporation, Tokyo (JP)

( * ) Notice: Subject to any disclaimer, the term of this patent is extended or adjusted under 35 U.S.C. 154(b) by 90 days.

(21) Appl. No.: 11/896,189

(22) Filed: Aug. 30, 2007

(65) Prior Publication Data

US 2008/0054273 A1 Mar. 6, 2008

(30) Foreign Application Priority Data

Aug. 31, 2006 (JP) .............................. 2006-235559

(51) Int. Cl.
*H01L 29/205* (2006.01)

(52) U.S. Cl. ........................................... 257/91; 257/79

(58) Field of Classification Search .................. 257/79, 257/91
See application file for complete search history.

(56) References Cited

FOREIGN PATENT DOCUMENTS

JP 2004-179641 6/2004

*Primary Examiner*—Douglas M Menz
(74) *Attorney, Agent, or Firm*—Kubotera & Associates, LLC

(57) ABSTRACT

A semiconductor device includes a plurality of light emitting elements formed of a thin layer of a compound semiconductor and arranged in a row in one direction with an equal interval therebetween. Each of the light emitting elements includes a light emitting area formed on a surface thereof; a first conductive type side electrode formed on the surface and electrically connected to one side of the light emitting element; and a second conductive type side electrode formed on the surface and electrically connected to the other side of the light emitting element. Further, the first conductive type side electrode is disposed at a position continuously surrounding at lease two sides of the light emitting area of the light emitting area with an insulating film inbetween. The second conductive type side electrode is disposed on the light emitting area.

18 Claims, 29 Drawing Sheets

SEMICONDUCTOR DEVICE, LIGHT EMITTING DIODE PRINT HEAD, AND IMAGE FORMING APPARATUS

BACKGROUND OF THE INVENTION AND RELATED ART STATEMENT

The present invention relates to a semiconductor device used for a light emitting diode (LED) array and the likes; a light emitting diode (LED) print head including the semiconductor device; and an image forming apparatus including the light emitting diode (LED) head. In the semiconductor device, a plurality of light emitting elements is formed of a thin layer formed of a compound semiconductor, and is arranged in one direction with an equal interval therebetween.

In a conventional image forming apparatus such as a printer using electro-photography technology, a plurality of light emitting diodes (LEDs) is arranged in a row to form an LED array chip, and a plurality of the LED array chips is arranged in a row to form an optical head (exposure head or LED print head). Recently, it has been required that an image forming apparatus such as a printer forms an image with high resolution. Accordingly, the number of the light emitting elements in the LED print head has increased drastically.

In the LED print head, a drive circuit of a light emitting diode may be formed in a substrate formed of silicon in advance. In a separate step, an LED array (LED array film) is formed in a thin layer formed of a compound semiconductor formed through an epitaxial growth process, so that the drive circuit is connected to the LED array film (refer to patent Reference).

Patent Reference: Japanese Patent Publication No. 2004-179641

In the LED print head described above, a plurality of LEDs is formed in the LED array film. Each of the LEDs includes an ohmic electrode on a front surface of the LED array film for contacting (ohmic contact or resistor type contact) with one of a p-type conductive side and an n-type conductive side. Another ohmic electrode is formed on a backside of the LED array film (facing the substrate with the drive circuit formed therein) for contacting the other of the p-type conductive side and the n-type conductive side. In the configuration, the ohmic electrodes formed on the backside of the LED array film are commonly connected to the LEDs arranged next to with each other, so that the LEDs concurrently emit light.

Alternatively, it may be configured that not all of the LEDs may emit light, thereby reducing heat and power consumption. In this case, the ohmic electrodes of both of the n-type conducive side and the p-type conductive side are disposed on the front surface of the LED array thin layer chip.

When the LED array chip is formed of the thin layer (LED array film), as opposed to the case that the LED array is directly formed on the substrate formed of a compound semiconductor, the LED array film has a relatively low strength. Accordingly, when the ohmic electrodes of both of the n-type conducive side and the p-type conductive side are disposed on the front surface (same surface) of the LED array thin layer chip, the ohmic electrodes tend to crack.

In particular, when the ohmic electrodes extend in a longitudinal direction of the LED array thin layer chip, the ohmic electrodes become susceptible to crack during a manufacturing process of connecting the ohmic electrodes to the drive circuits, or upon receiving a stress or a temperature change.

In view of the problems described above, an object of the present invention is to provide a semiconductor device with improved reliability, in which a semiconductor thin layer is provided with an electrode and a contact portion with high reliability even when ohmic electrodes of both of an n-type conducive side and a p-type conductive side are disposed on a same surface of an LED array thin layer chip and the ohmic electrodes partially crack.

Further objects and advantages of the invention will be apparent from the following description of the invention.

SUMMARY OF THE INVENTION

In order to attain the objects described above, according to a first aspect of the present invention, a semiconductor device includes a plurality of light emitting elements formed of a thin layer of a compound semiconductor and arranged in a row in one direction with an equal interval therebetween. Each of the light emitting elements includes a light emitting area formed on a surface thereof; a first conductive type side electrode formed on the surface and electrically connected to one side of the light emitting element; and a second conductive type side electrode formed on the surface and electrically connected to the other side of the light emitting element.

Further, the first conductive type side electrode is disposed at a position continuously surrounding at lease two sides of the light emitting area with an insulating film inbetween. The second conductive type side electrode is disposed on the light emitting area.

According to a second aspect of the present invention, a light emitting diode print head includes the semiconductor device in the first aspect; a drive circuit for selectively driving the light emitting elements; and a holding member for holding the semiconductor device and the drive circuit. The light emitting elements are formed of light emitting diodes.

According to a third embodiment of the present invention, an image forming apparatus includes a photosensitive member; a charging device for charging a surface of the photosensitive member; the light emitting diode print head in the second aspect for selectively exposing the surface of the photosensitive member to form a static latent image; and a developing device for developing the static latent image.

In the semiconductor device of the present invention, the first conductive type side electrode is disposed at the position continuously surrounding at lease two sides of the light emitting area in an area arranged in a direction that the light emitting area is arranged. Accordingly, when one of the electrodes on the surface of the LED array thin layer chip cracks, it is possible to prevent misconnection, so that the semiconductor thin layer element and the semiconductor device (light emitting array) are provided with the electrode and a contact portion with high reliability.

DETAILED DESCRIPTION OF PREFERRED EMBODIMENTS

Hereunder, embodiments of the present invention will be explained with reference to the accompanying drawings.

First Embodiment

A first embodiment of the present invention will be explained. An image forming apparatus includes a photosensitive member; an optical head or LED (light emitting diode) print head formed of an LED element as a light emitting element for selectively exposing a surface of the photosensitive member to form a static latent image; and a developing unit for developing the static latent image thus exposed. The LED print head includes a semiconductor device (LED array) including the light emitting element; a drive circuit for driving the light emitting element of the semiconductor device; and a supporting member for supporting the semiconductor device and the drive circuit.

In the semiconductor device, four of the light emitting elements are disposed in a thin layer chip formed of a compound semiconductor, and are arranged as one block in a row in one direction with an equal pitch therebetween. The first to fourth ones of the light emitting elements are separately driven in this order (separate drive method). In particular, the first one of the light emitting elements is disposed at a left end side in FIG. 1, and the second one of the light emitting elements is disposed next to the first one thereof.

Figure 1:
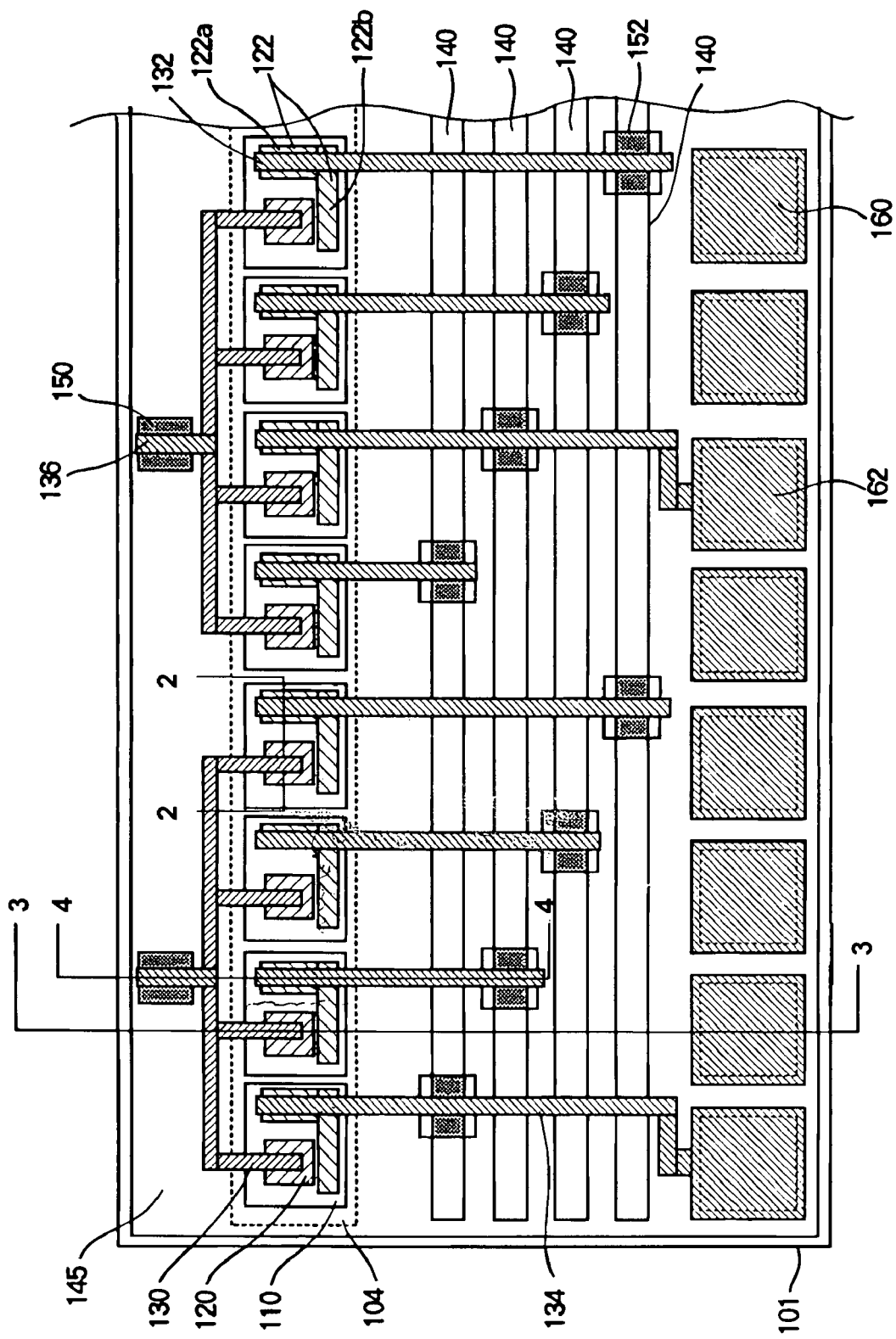
FIG. 1 is a schematic plan view showing a semiconductor device (LED array) of an LED (light emitting diode) print head of an image forming apparatus according to a first embodiment of the present invention.

The light emitting elements are arranged in the arrangement shown in FIG. 1 as an example, and may be arranged differently. In particular, it is possible to arbitrarily change the number of the light emitting elements; an arrangement and the number of light emitting areas (described later); the number of the light emitting elements in one block; and the number of blocks disposed in one chip. Further, it is possible to arbitrarily adapt a concurrent drive method (wiring pattern) instead of the separate drive method.

In the embodiment, the light emitting elements in the semiconductor thin layer are formed of a compound semiconductor such as AlGaAs, and may be formed of InP, GaSaP, GaInAsP, AlGaAsP, and a nitride compound semiconductor such as GaN, AlGaN, and InGaN.

Figure 2:
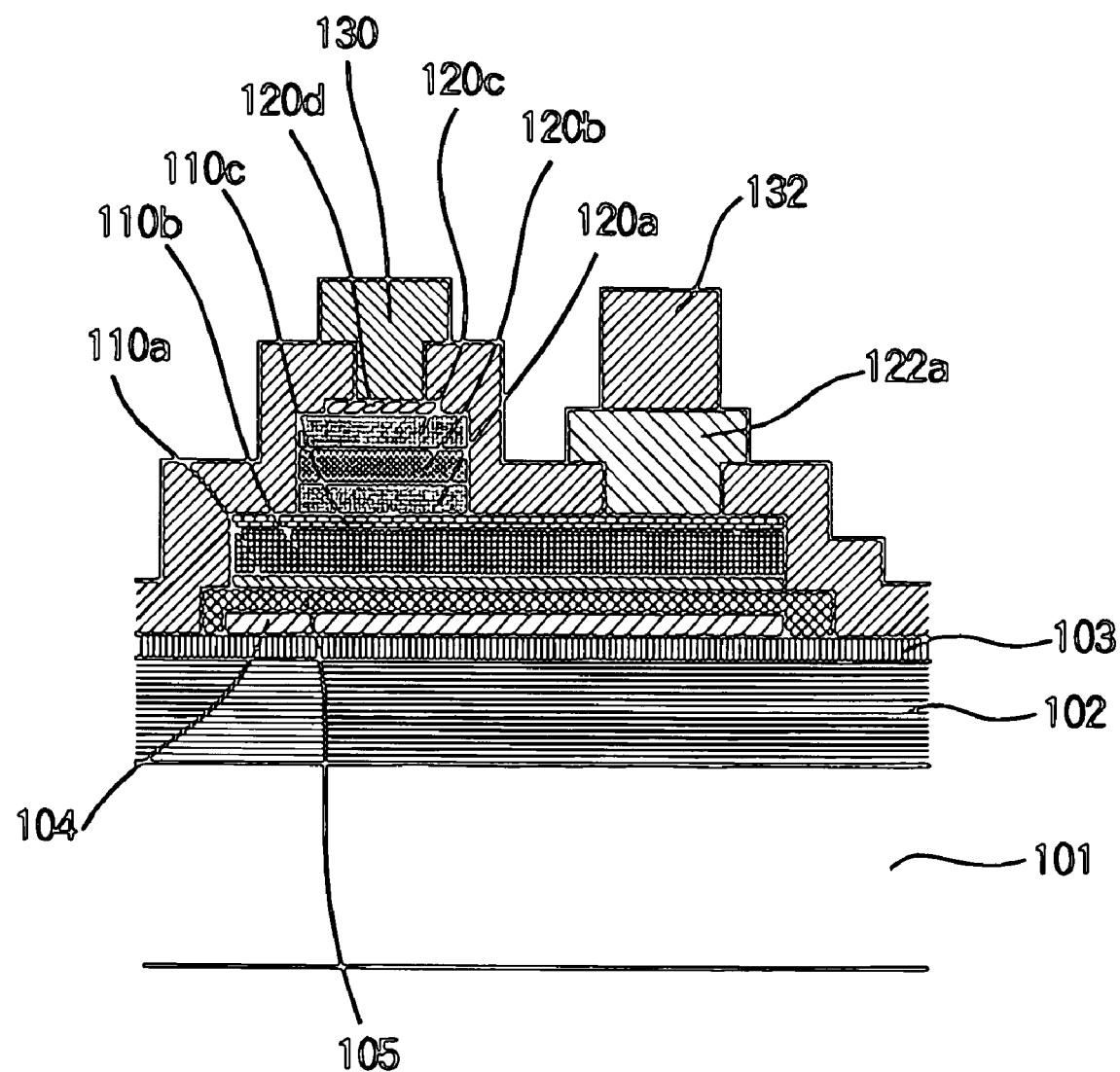
FIG. 2 is a schematic sectional view of the semiconductor device taken along a line 2-2 in FIG. 1 according to the first embodiment of the present invention.
Figure 3:
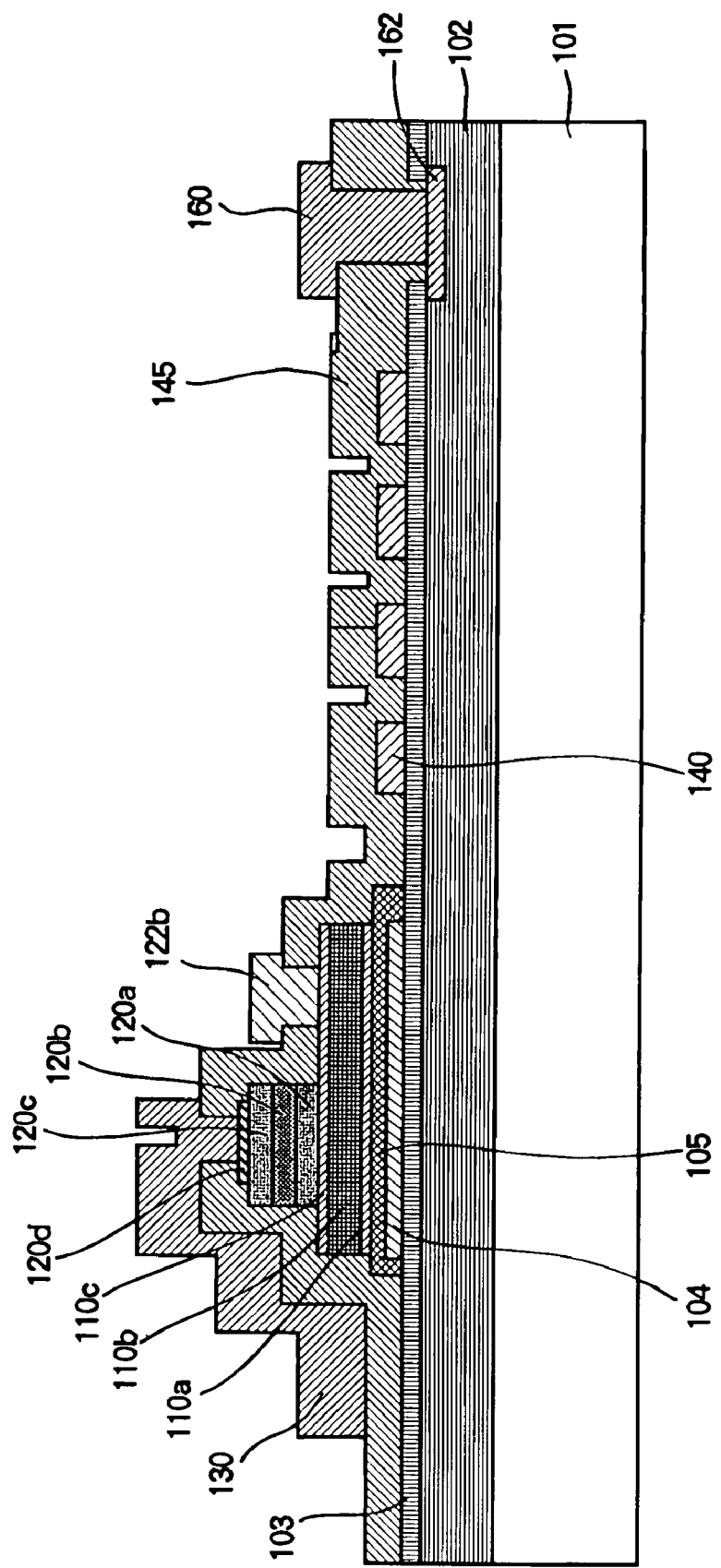
FIG. 3 is a schematic sectional view of the semiconductor device taken along a line 3-3 in FIG. 1 according to the first embodiment of the present invention.
Figure 4:
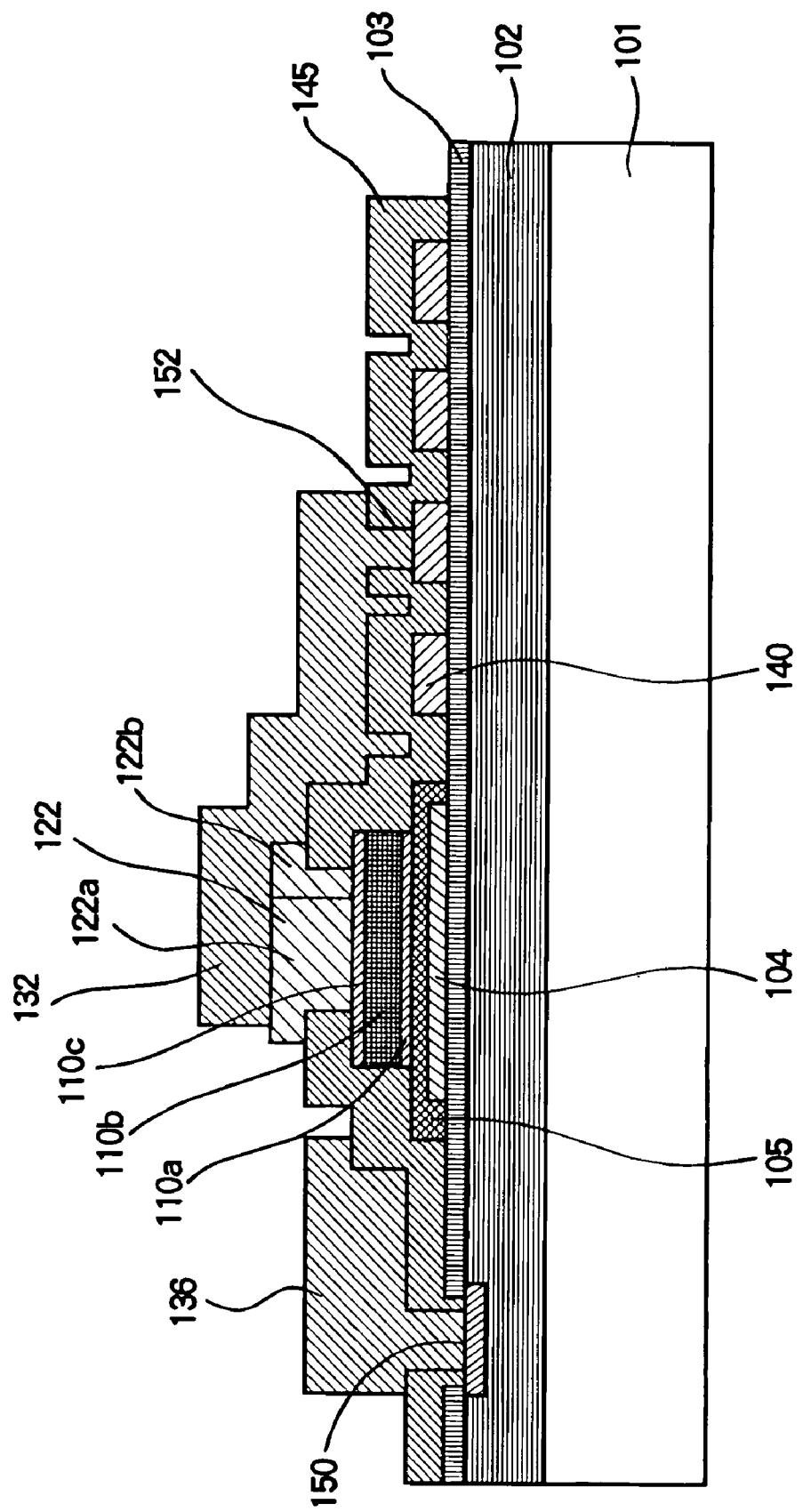
FIG. 4 is a schematic sectional view of the semiconductor device taken along a line 4-4 in FIG. 1 according to the first embodiment of the present invention.

FIG. 1 is a schematic plan view showing the semiconductor device (LED array) of the LED (light emitting diode) print head of the image forming apparatus according to the first embodiment of the present invention. FIG. 2 is a schematic sectional view of the semiconductor device taken along a line 2-2 in FIG. 1 according to the first embodiment of the present invention. FIG. 3 is a schematic sectional view of the semiconductor device taken along a line 3-3 in FIG. 1 according to the first embodiment of the present invention. FIG. 4 is a schematic sectional view of the semiconductor device taken along a line 4-4 in FIG. 1 according to the first embodiment of the present invention.

As shown in FIG. 1, the semiconductor device is provided with a substrate 101 formed of a silicon substrate having an integrated circuit. An integrated circuit layer 102 is formed on the substrate 101, and an insulating layer 103 is formed on the integrated circuit layer 102. A reflection layer 104 is formed on the insulating layer 103 for upwardly reflecting light emitting from light emitting portions 120. The reflection layer 104 may be formed of Ti, Ti/PtAu, TiAl, Cr/Au, NiAl, Ag, an Au type alloy containing Ag, an Al type alloy, and an Ag type alloy. A flattening layer 105 is provided for directly bonding the semiconductor thin layer.

In the embodiment, light emitting portions 120 are formed in semiconductor thin layers 110. Each of thin semiconductor layers 110 constitutes a semiconductor, and is formed of epitaxial semiconductor thin layers 110a to 110c, i.e., a first layer 110a, a second layer 110b, and an n-side contact layer 110c. Each of the light emitting portions 120 is formed of epitaxial semiconductor thin layers 120a to 120d, i.e., clad layers 120a and 120c, an active layer 120b, and a p-side contact layer 120d.

More specifically, the thin semiconductor layer 110 includes the first layer 110a formed of n-GaAs; the second layer 110b formed of n-Al$_t$Ga$_{1-t}$As; and the n-side contact layer 110c formed of n-GaAs. The thin semiconductor layer 120 includes the clad layer 120a formed of n-Al$_z$Ga$_{1-z}$As; the active layer 120b formed of n-Al$_y$Ga$_{1-y}$As; the clad layer 120c formed of p-Al$_x$Ga$_{1-x}$As; and the p-side contact layer 120d formed of p-GaAs.

In the embodiment, first conductive type side electrodes 122 are provided for contacting one of a p-type semiconductor and an n-type semiconductor formed in the semiconductor thin layer (n-side electrodes in the embodiment).

As shown in FIG. 1, each of the first conductive type side electrodes 122 has an electrode portion 122a adjacent to a side of a rectangular shape of one of the light emitting portions 120 in a direction that the light emitting portions 120 are arranged. Further, each of the first conductive type side electrodes 122 has an electrode portion 122b adjacent to another side of the rectangular shape next to the side (in a direction perpendicular to the direction that the light emitting portions 120 are arranged). Accordingly, the electrode portion 122a and the electrode portion 122b are arranged to surround two of four sides of the rectangular shape of one of the light emitting portions 120.

The electrode portion 122a and the electrode portion 122b of each of the first conductive type side electrodes 122 are formed of a material such as, for example, AuGe/Ni/Au, for forming an ohmic contact with a GaAs layer.

In the embodiment, second conductive type side electrodes 130 are provided for forming an ohmic contact with the light emitting portions 120 formed in the semiconductor thin layers, and may be formed of a material such as Ti/Pt/Au for forming an ohmic contact with a GaAs layer.

In the embodiment, first conductive type side wiring patterns 132 and 134 may be formed of Ti/Pt/Au. The first conductive type side wiring patterns 132 constitute wiring patterns on the first conductive type side electrodes 122.

In the embodiment, second conductive type side wiring patterns or second conductive type side electrodes 136 are formed in the semiconductor thin layers for contacting the other of the p-type semiconductor and the n-type semiconductor (p-side electrodes in the embodiment). Common wiring patterns 140 are provided for connecting the first conductive type side wiring patterns 132 and 134 in each of blocks at a same potential.

In the embodiment, the semiconductor device is provided with an interlayer insulation layer 145 and contact pads 150 for connecting the second conductive type side wiring patterns 136 and integrated circuits such as drive circuits. Common wiring connecting opening portions 152 are provided in the interlayer insulation layer 145 for connecting the first conductive type side wiring patterns 132 and 134 and the common wiring patterns 140.

In the embodiment, connecting pads 160 are provided for connecting the first conductive type side wiring patterns 132 and 134 and the integrated circuits such as drive circuits. Wiring connecting areas 162 are provided on the connecting pads 160 for connecting wiring patterns, and may completely cover the connecting pads 160.

As described above, in the semiconductor device, a plurality of the light emitting elements is formed of the thin layers formed of a compound semiconductor, and is arranged in a row in one direction with an equal pitch therebetween. The light emitting portions 120 with a rectangular shape are disposed in the light emitting elements, respectively.

Further, the first conductive type side electrodes 122 as the ohmic electrode are formed on a surface of the thin layers of the light emitting elements, and are electrically connected to one side (for example, n-type) of the light emitting elements. The second conductive type side electrodes 130 as the ohmic electrode are formed on the same surface and electrically connected to the other side (for example, p-type) of the light emitting elements.

Further, the first conductive type side electrodes 122 are disposed at positions continuously surrounding at lease two sides of the rectangular shape of the light emitting areas 120 with the interlayer insulating layer 145 inbetween. The second conductive type side electrodes 130 are disposed on the light emitting areas 120.

Accordingly, the first conductive type side electrode 122 is disposed partially at lease in an area adjacent to the light emitting area 120 in the arrangement direction thereof. Further, an electrode portion corresponding to at least one of the light emitting areas 120 arranged next to each other is disposed partially at lease in an area therebetween.

Further, in the embodiment, a first conductive semiconductor and a second conductive semiconductor are laminated to form a structure including a pn connection, and the structure is elementally separated through mesa etching, thereby forming the light emitting element of the semiconductor device.

As described above, in the semiconductor device (light emitting element array), the first conductive type side electrode 122 is disposed at two sides of the light emitting area 120. Accordingly, when a crack is generated in the semiconductor thin layer between the light emitting area 120 and the first conductive type side electrode in a direction perpendicular to the direction that the light emitting areas 120 are arranged, it is possible to maintain the semiconductor thin layer between the light emitting area 120 and the first conductive type side electrode 122 along the direction that the light emitting areas 120 are arranged. As a result, the light emitting element works normally, thereby improving reliability of the semiconductor device (light emitting element array).

Figure 5:
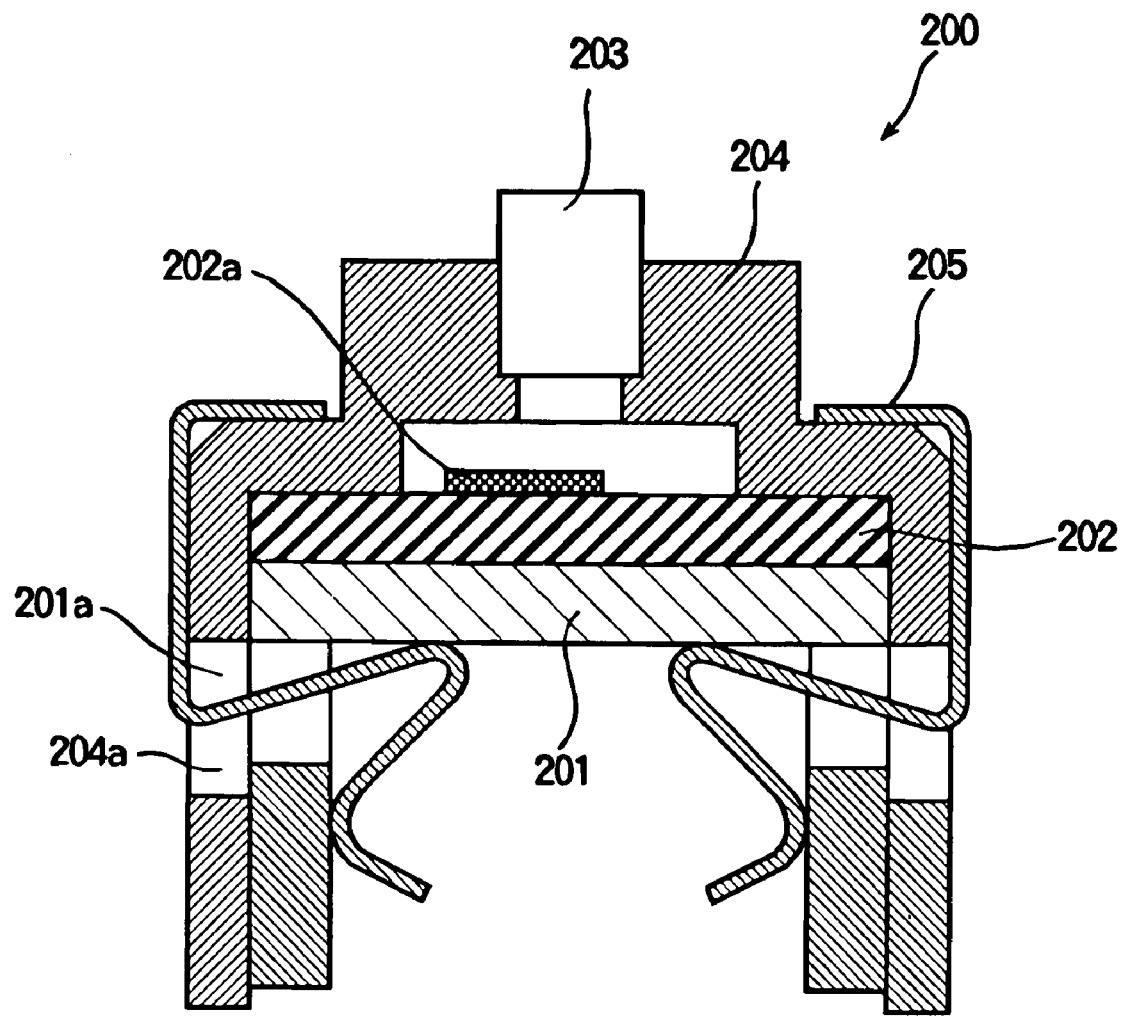
FIG. 5 is a schematic sectional view an LED print head formed of the semiconductor device according to the first embodiment of the present invention.
Figure 6:
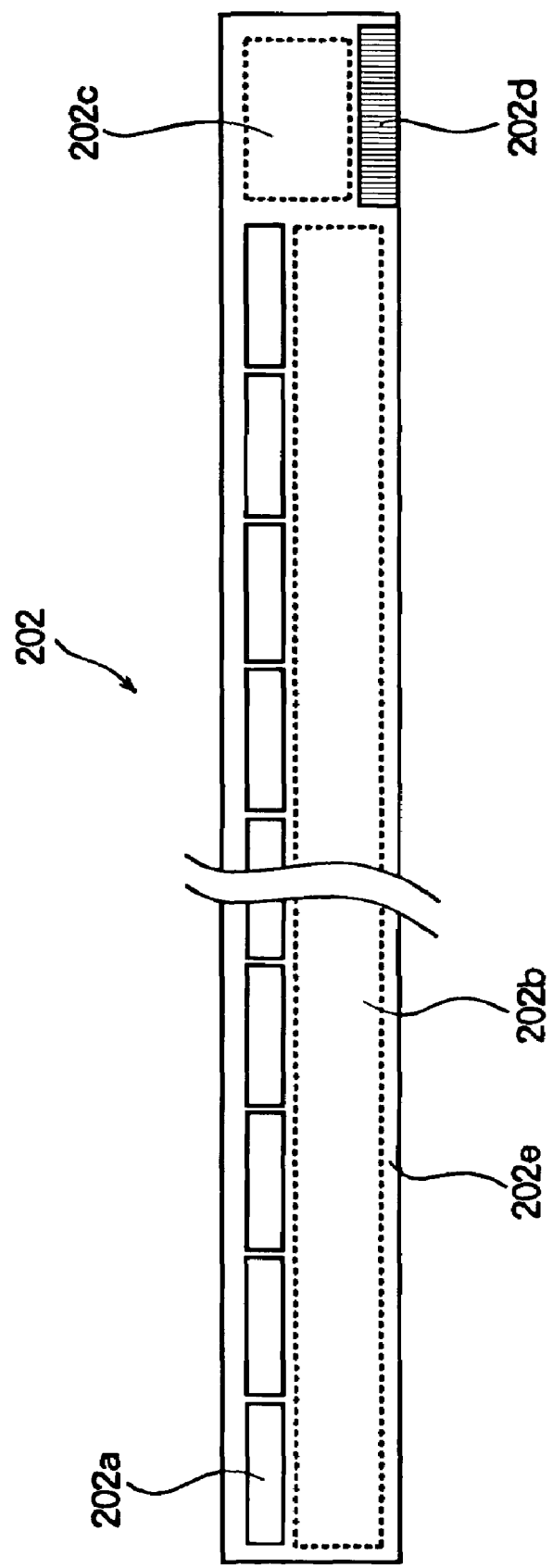
FIG. 6 is a schematic plan view showing an LED unit in the LED print head according to the first embodiment of the present invention.

FIG. 5 is a schematic sectional view an LED print head 200 formed of the semiconductor device according to the first embodiment of the present invention. FIG. 6 is a schematic plan view showing an LED unit in the LED print head 200 shown in FIG. 5 according to the first embodiment of the present invention.

As shown in FIG. 5, an LED unit 202 is mounted on a base member 201. As shown in FIG. 6, in the LED unit 202, a plurality of the semiconductor devices is arranged on a mounting substrate 202e as light emitting units 202a along a longitudinal direction. In each of the semiconductor devices, the light emitting areas 120 in one block and the drive portion are combined. On the mounting substrate 202e, there are disposed electrical device mounting areas 202b and 202c for mounting electrical devices and wiring patterns, and a connector 202d for supplying a control signal and power from outside.

In the embodiment, a rod lens array 203 is disposed on the light emitting units 202a as an optical element for conversing light emitting from the light emitting portion 120. In the rod lens array 203, a plurality of optical lenses with a column shape is arranged along the light emitting units 202a arranged linearly. A lens holder 204 as an optical element holder holds the rod lens array 203 at a specific position.

As shown in FIG. 5, the lens holder 204 covers the base member 201 and the LED unit 202. A clamper 205 is arranged through opening portions 201a and 204a formed in the base member 201 and the lens holder 204, so that the clamper 205 integrally holds the base member 201, the LED unit 202, and the lens holder 204. Accordingly, light emitting from the light emitting units 202a of the LED unit 202 irradiates a specific outer member through the rod lens array 203.

In the embodiment, the LED print head 200 with the configuration described above is used as an exposure device of a photoelectric printer or a photoelectric copier. Accordingly, the LED print head 200 is formed of the LED unit 202 having the semiconductor devices with high reliability. As a result, it is possible to provide the LED print head with high reliability.

Figure 7:
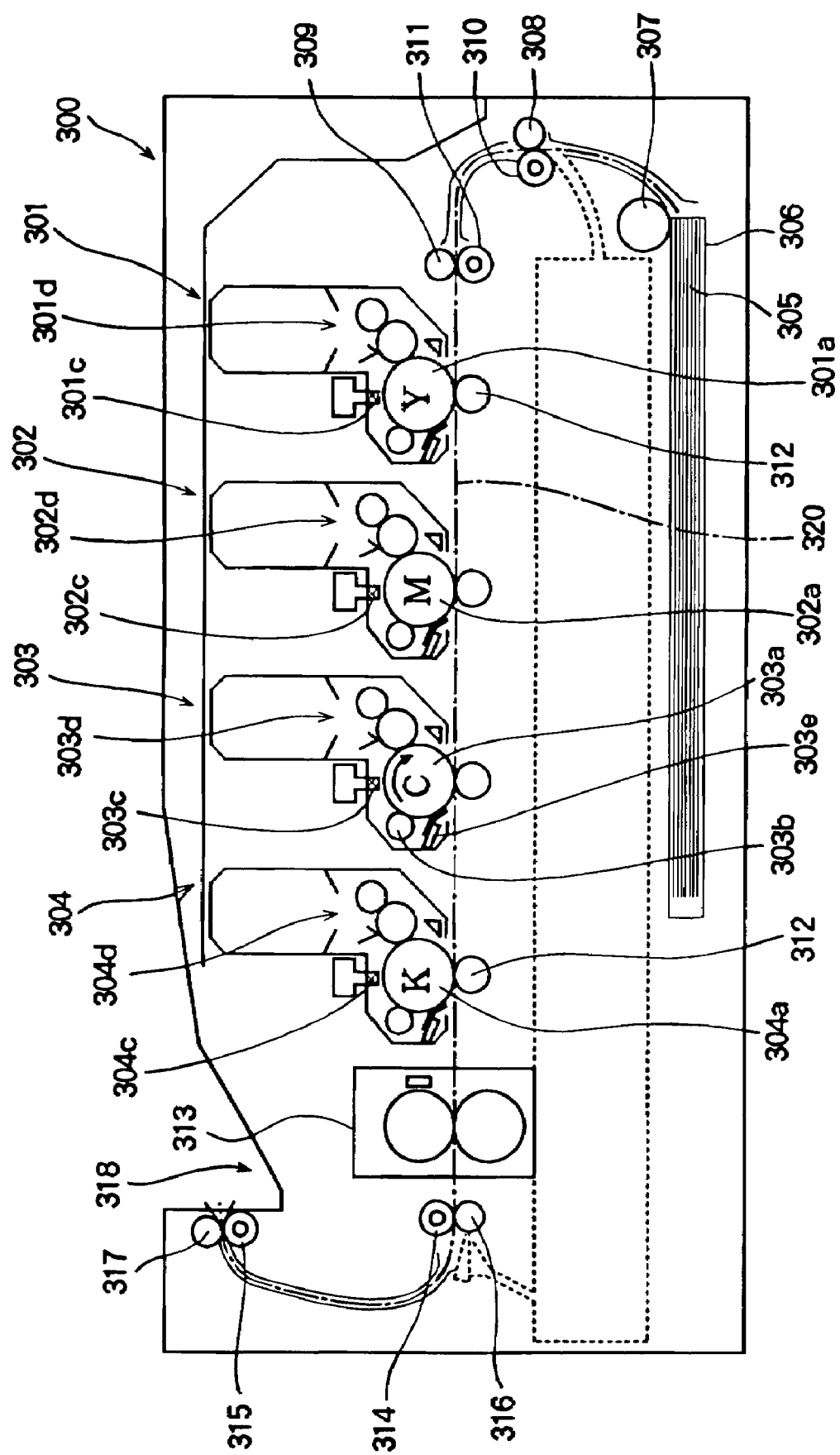
FIG. 7 is a schematic view showing an image forming apparatus including the LED print head shown in FIG. 5 according to the first embodiment of the present invention.

FIG. 7 is a schematic view showing an image forming apparatus 300 including the LED print head shown in FIG. 5 according to the first embodiment of the present invention. As shown in FIG. 7, in the image forming apparatus 300, four process units 301 to 304 are arranged in this order from an upstream side along a transport path 320 of a recoding medium 305 for forming images in yellow, magenta, cyan, and black, respectively. The process units 301 to 304 have an identical internal configuration, and the process unit 303 will be explained as an example.

In the process unit 303, a photosensitive drum 303a as an image supporting member is disposed to be rotatable in an arrow direction. Around the photosensitive drum 303a from an upstream side with respect to rotation of the photosensitive drum 303a, there are arranged a charging device 303b for applying a voltage and charging a surface of the photosensitive drum 303a; and an exposure device 303c for selectively irradiating light on the surface of the photosensitive drum 303a thus charged to form a static latent image thereon.

Further, there are arranged a developing device 303d for attaching toner of a specific color (cyan) to the surface of the photosensitive drum 303a with the latent image formed thereon to visualize (develop) the static latent image; and a cleaning device 303e for removing toner remaining on the surface of the photosensitive drum 303a. Note that the photosensitive drum 303a, the charging device 303b, the exposure device 303c, the developing device 303d, and the cleaning device 303e are driven with a drive source and a gear (not shown).

In the embodiment, the image forming apparatus 300 is provided with a sheet cassette 306 at a lower portion thereof for storing the recording medium 305 in a stacked state, and a hopping roller 307 above the sheet cassette 307 for separating and transporting the recording medium 305 one by one. On a downstream side of the hopping roller 307 in a direction that the recording medium 305 is transported, pinch rollers 308 and 309 and register rollers 310 and 311 are disposed for sandwiching the recording medium 305 to correct skew of the recording medium 305 and transporting the recording medium 305 to the process units 301 to 304. Note that the hopping roller 307 and the register rollers 310 and 311 are driven with a drive source and a gear (not shown).

In the process units 301 to 304, transfer rollers 312 formed of a semi-conductive rubber and the likes are disposed at positions facing the photosensitive drums 301a to 304a. It is arranged such that a specific potential is generated between the surfaces of the photosensitive drums 301a to 304a and the transfer rollers 312, so that toner on the photosensitive drums 301a to 304a is attached to the recording medium 305.

In the embodiment, a fixing device 313 includes a heating roller and a back-up roller, so that toner transferred to the recording medium 305 is heated and pressed for fixing. Discharge roller 314 and 315 sandwich the recording medium 305 discharged from the fixing device 313 with pinch rollers 316 and 317, so that the recording medium 305 is transported to a recording medium stacker portion 318. Note that the discharge roller 314 and 315 are driven with a drive source and a gear (not shown). The LED print head 200 is disposed in the exposure device 303c.

An operation of the image forming apparatus 300 will be explained next. First, the hopping roller 307 separates and transports the recording medium 305 stored in the sheet cassette 306 in a stacked state. The register rollers 310 and 311 and the pinch rollers 308 and 309 sandwich the recording medium 305, thereby transporting the recording medium 305 to the photosensitive drum 301a and the transfer roller 312. Then, the photosensitive drum 301a and the transfer roller 312 sandwich the recording medium 305 to transfer a toner image to the recording medium 305, while the photosensitive drum 301a rotates to transport the recording medium 305.

Similar to the process described above, the recording medium 305 sequentially passes through the process units 302 to 304. Accordingly, the developing devices 301d to 304d develop the latent images formed with the exposure devices 301c to 304c to form the toner images in colors, and the toner images are sequentially transferred and overlapped on the recording medium 305.

After the toner images are overlapped on the recording medium 305, the fixing device 313 fixes the toner images. Afterward, the discharge rollers 314 and 315 and the pinch rollers 316 and 317 sandwich the recording medium 305 to discharge to the recording medium stacker portion 318 outside the image forming apparatus 300. Through the process described above, a color image is formed on the recording medium 305.

As described above, with the LED print head with high reliability, it is possible to provide the image forming apparatus with improved quality and high reliability.

Second Embodiment

Figure 8:
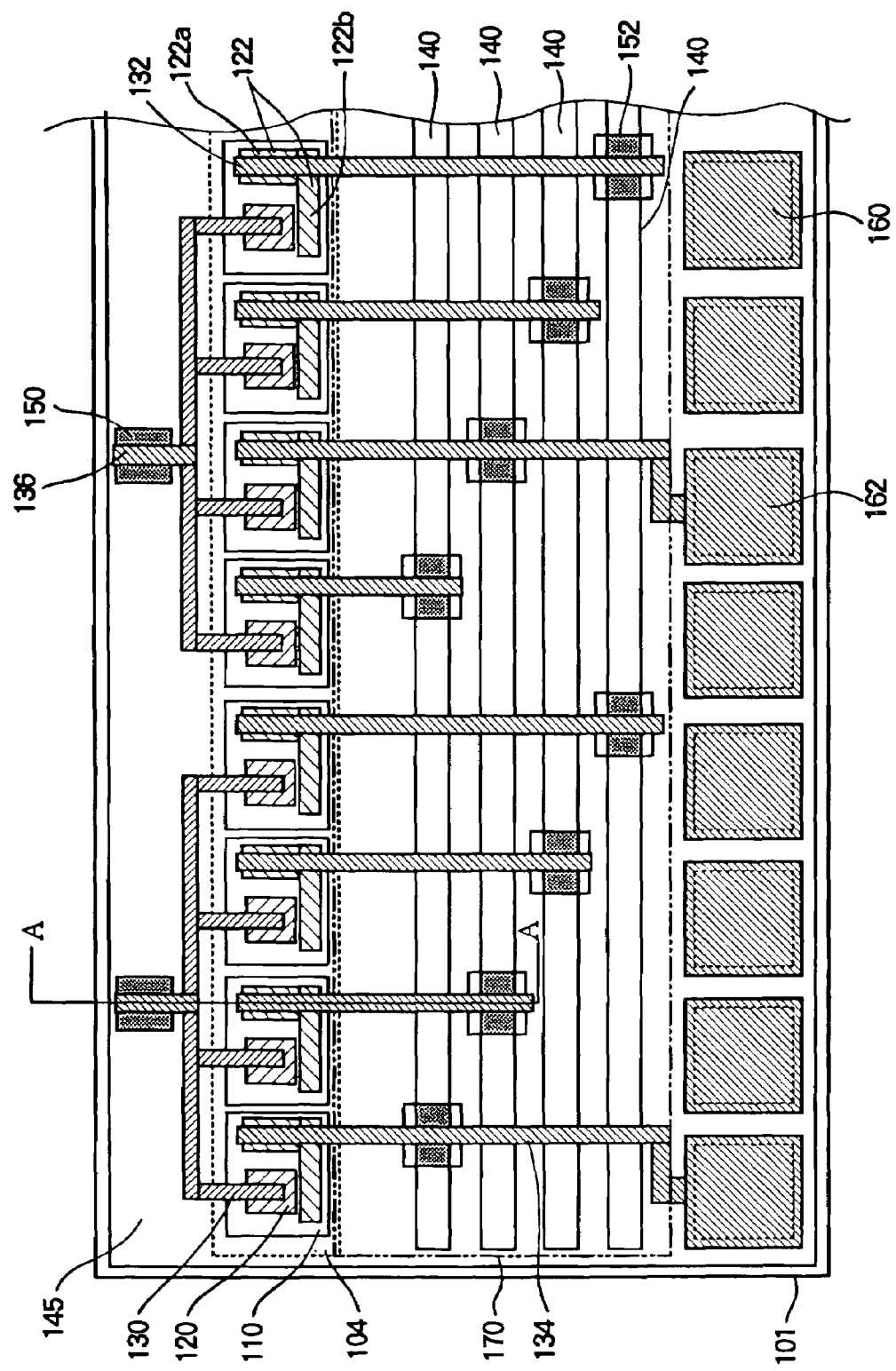
FIG. 8 is a schematic plan view showing a semiconductor device according to a second embodiment of the present invention.
Figure 9:
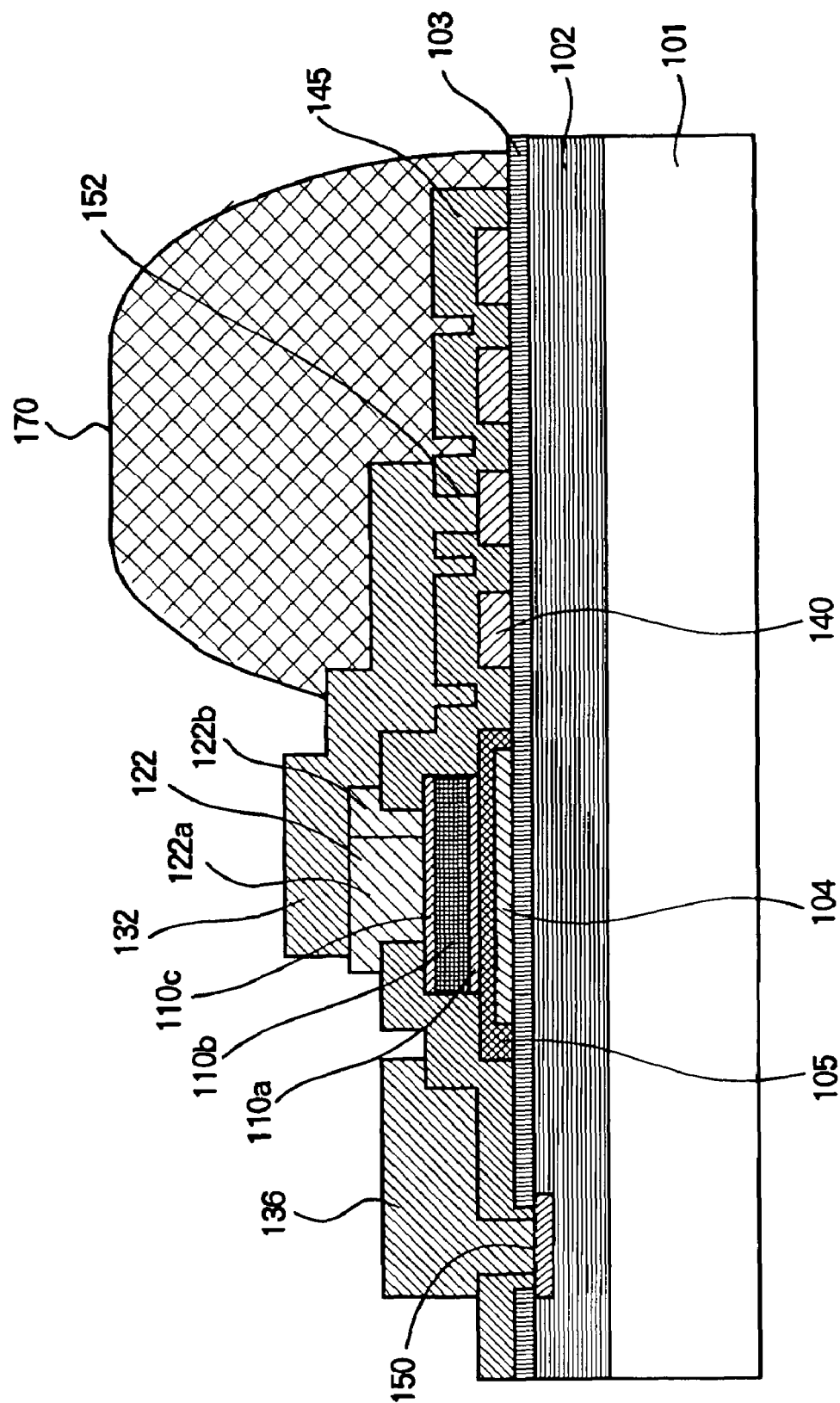
FIG. 9 is a schematic sectional view of the semiconductor device taken along a line 9-9 in FIG. 8 according to the second embodiment of the present invention.

A second embodiment of the present invention will be explained next. FIG. 8 is a schematic plan view showing a semiconductor device according to the second embodiment of the present invention. FIG. 9 is a schematic sectional view of the semiconductor device taken along a line 9-9 in FIG. 8 according to the second embodiment of the present invention. Components in the second embodiment similar to the components in the first embodiment are designated with the same reference numerals, and explanations thereof are omitted.

As shown in FIGS. 8 and 9, the semiconductor device in the second embodiment is provided with a light blocking layer 170 for blocking light from outside in an area without the light emitting areas 120, the first conductive type side electrodes 122, and the second conductive type side electrodes 130. The light blocking layer 170 has edge portions close to the light emitting areas 120. Accordingly, it is possible to reduce an influence of external light or reflection light in the LED print head.

In the embodiments described above, the light emitting element array and the drive circuit are integrated on the Si substrate, and are not necessarily formed on the Si substrate. Further, the configuration is not limited to the one in which the drive integrated circuit and the LED light emitting array are integrated on the Si substrate. Instead of the Si substrate, an integrated circuit (formed of, for example, poly-silicon) and a light emitting element array are integrated on a glass substrate, a ceramic substrate, a metal substrate, or an organic substrate.

In the embodiments described above, the first conductive type side electrodes 122 are formed of a material different from that of the second conductive type side electrodes 130, and may be formed of a same material. The LEDs are arranged in the LED array in a row, and may be arranged in several rows. Instead of a plurality of the LEDs, a single LED may be disposed. A plurality of LEDS may be formed of different materials.

Third Embodiment

Figure 10:
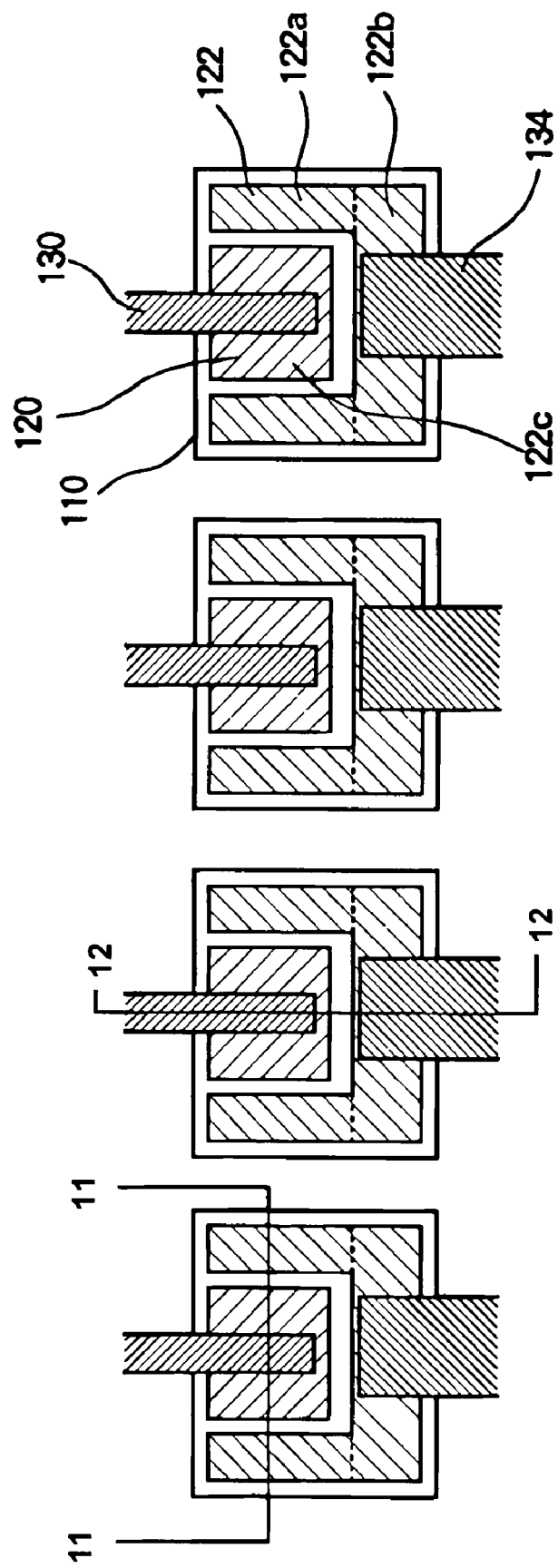
FIG. 10 is a schematic enlarged plan view showing a semiconductor device (LED array) according to a third embodiment of the present invention.
Figure 11:
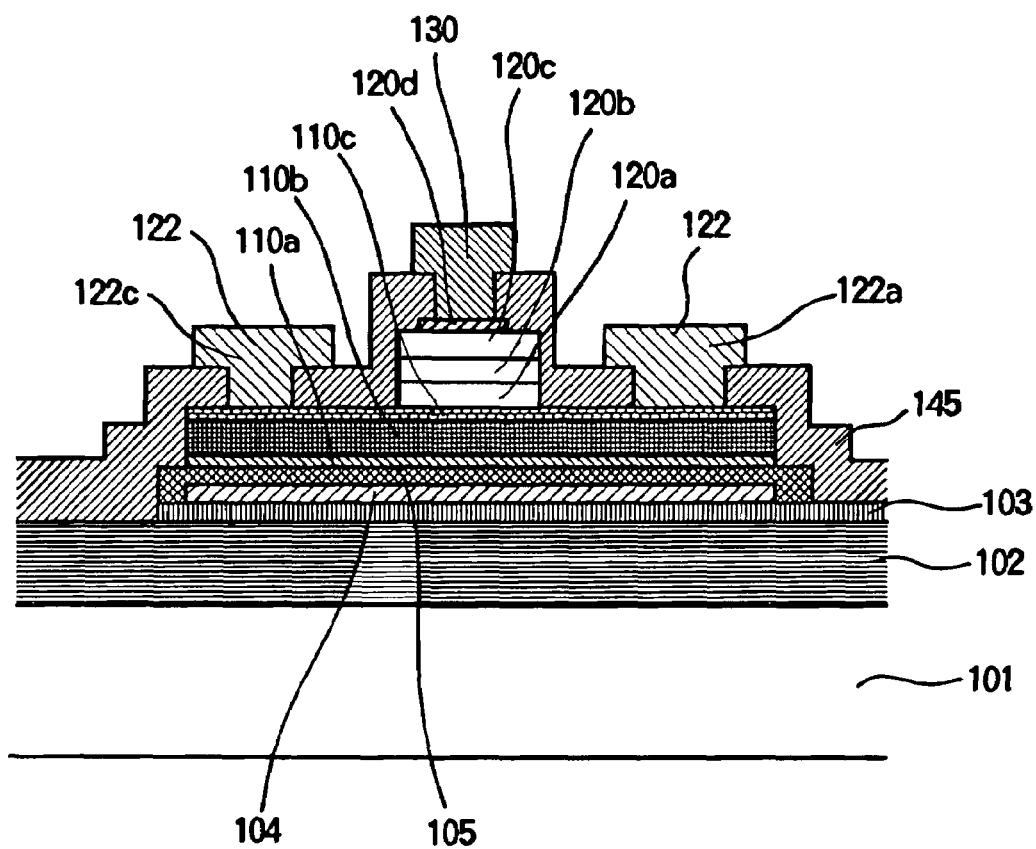
FIG. 11 is a schematic sectional view of the semiconductor device taken along a line 11-11 in FIG. 10 according to the third embodiment of the present invention.
Figure 12:
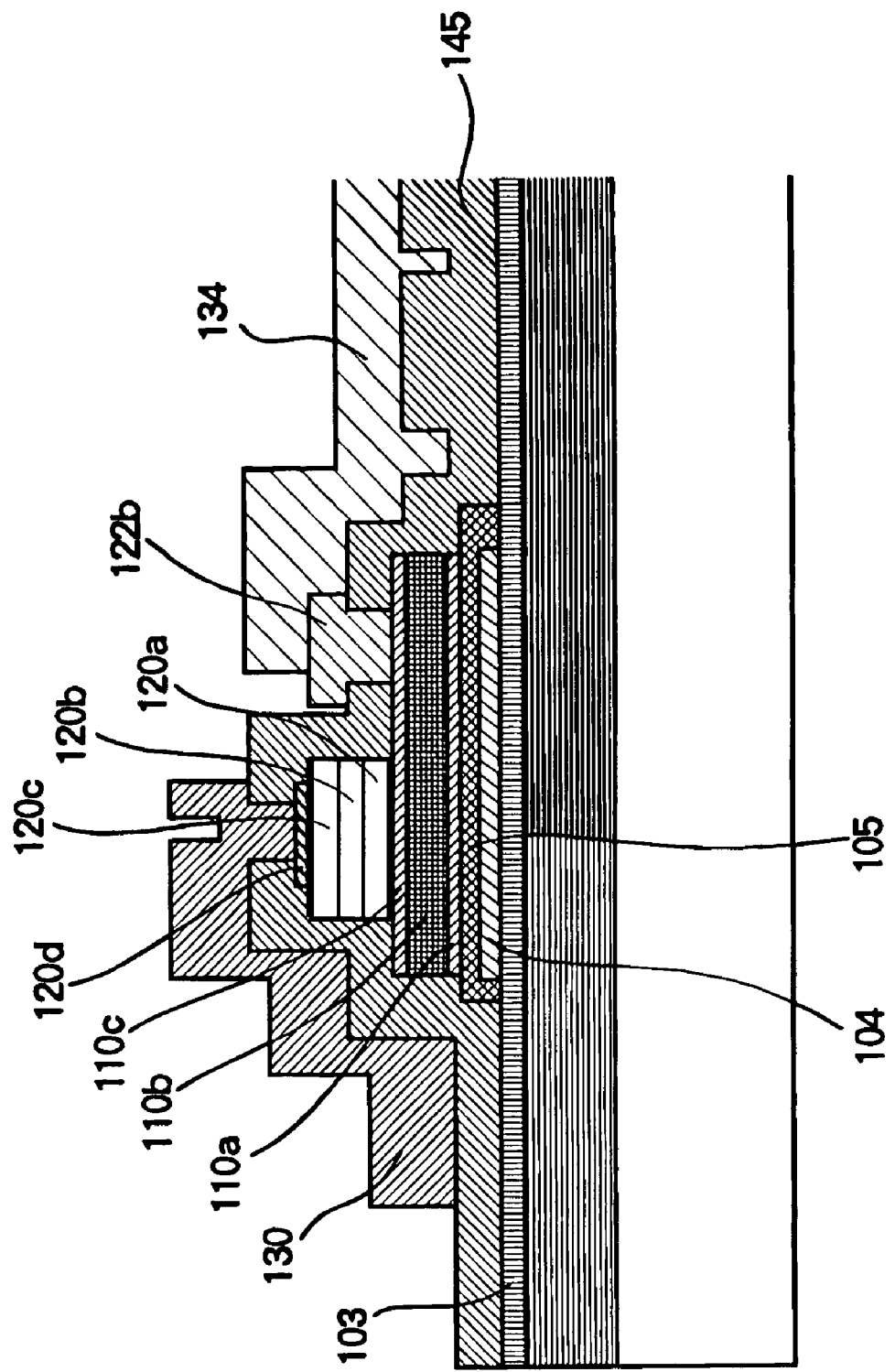
FIG. 12 is a schematic sectional view of the semiconductor device taken along a line 12-12 in FIG. 10 according to the third embodiment of the present invention.

A third embodiment of the present invention will be explained next. FIG. 10 is a schematic enlarged plan view showing a semiconductor device (LED array) according to a third embodiment of the present invention. FIG. 11 is a schematic sectional view of the semiconductor device taken along a line 11-11 in FIG. 10 according to the third embodiment of the present invention. FIG. 12 is a schematic sectional view of the semiconductor device taken along a line 12-12 in FIG. 10 according to the third embodiment of the present invention. Components in the third embodiment similar to the components in the first and second embodiments are designated with the same reference numerals, and explanations thereof are omitted.

In the third embodiment, different from the first embodiment, the first conductive type side electrodes 122 are formed in an area outside three sides of the light emitting areas 120. In particular, each of the first conductive type side electrodes 122 includes electrode portions 122a to 122c.

In the embodiment, as shown in FIG. 10, each of the first conductive type side electrodes 122 includes the electrode portions 122a to 122c surrounding three sides of each of the light emitting areas 120. The electrode portions 122a and 122c are arranged to surround both sides of each of the light emitting areas 120 in the direction that the light emitting areas 120 are arranged. The electrode portion 122b is arranged to surround one side next to the sides where the electrode portions 122a and 122c are arranged (side in the direction perpendicular to the direction that the light emitting areas 120 are arranged).

Accordingly, each of the first conductive type side electrodes 122 surrounds three sides of each of the light emitting areas 120, except one side crossing the second conductive type side electrode 130 and the wiring pattern 136.

As described above, in the embodiment, each of the first conductive type side electrodes 122 surrounds three sides of each of the light emitting areas 120. Accordingly, as opposed to the first embodiment, it is possible to further improve reliability of the light emitting element.

Fourth Embodiment

Figure 13:
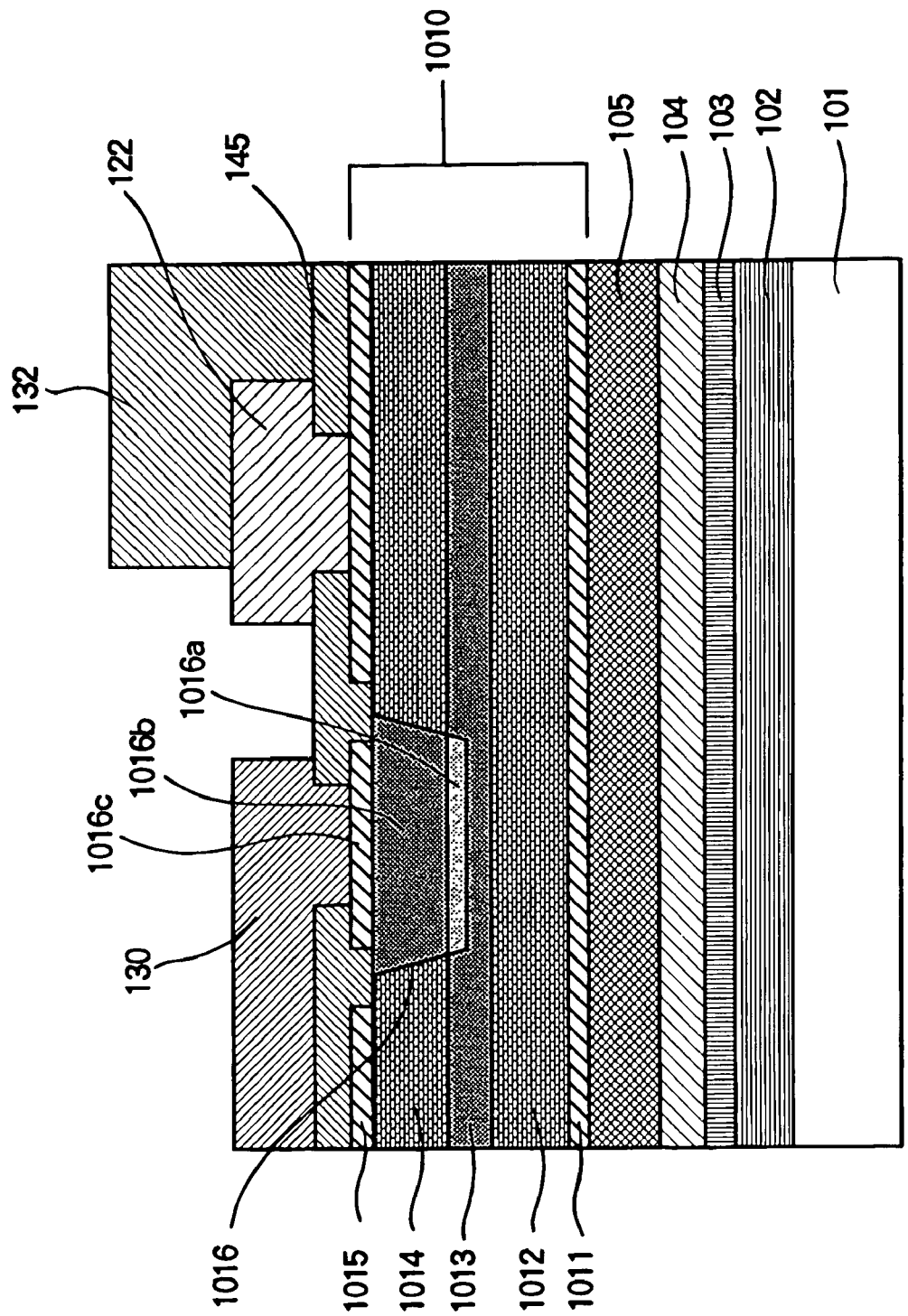
FIG. 13 is a schematic sectional view showing a semiconductor device according to a fourth embodiment of the present invention.

A fourth embodiment of the present invention will be explained next. FIG. 13 is a schematic sectional view showing a semiconductor device according to the fourth embodiment of the present invention. Components in the fourth embodiment similar to the components in the first to third embodiments are designated with the same reference numerals, and explanations thereof are omitted.

As described previously, in the second embodiment shown in FIGS. 10 to 12, when the light emitting areas 120 are formed in the layered structure of the semiconductor thin layers, the first conductive semiconductor layer and the second conductive semiconductor layer are laminated to form the layered structure of the semiconductor thin layers including the pn connection. Then, the semiconductor thin layers are elementally separated through the mesa etching, thereby forming the light emitting element of the semiconductor device.

In the fourth embodiment, the light emitting areas 120 are formed in a different process. As shown in FIG. 13, after the first conductive semiconductor layer is laminated in a layered structure, a second conductive impurity is selectively diffused into the layered structure. That is, an impurity is doped into the layer structure of the semiconductor thin layer, or the impurity is selectively diffused into the layered structure of the semiconductor thin layer.

As shown in FIG. 13, a semiconductor thin layer 1010 includes first conductive semiconductor layers 1011 to 1015, i.e., a layer 1011 formed of GaAs; a clad layer 1012 formed of $Al_zGa_{1-z}As$; an active layer 1013 formed of $Al_yGa_{1-y}As$; a clad layer 1014 formed of $Al_xGa_{1-x}As$; and a layer 1015 formed of GaAs.

In the embodiment, a diffusion area 1016 includes second conductive areas 1016a to 1016c formed through selectively diffusing an impurity into the first conductive semiconductor layers. The front layer 1016a of the diffusion area 1016 is situated in the active layer 1013. Each of the semiconductor layers includes a composition of Al at a ratio of x, y, or z, in which y is smaller than x or z. The diffusion area 1016a is situated in the clad layer 1014, and the contact layer 1016c is formed on the diffusion area 1016a.

In the embodiment, the second conductive electrode 130 and the contact portion are formed on the light emitting area using a metal material, and may be formed of a transparent material such as ITO and ZnO.

As described above, in the embodiment, the impurity of the second conductive semiconductor is selectively diffused into the first conductive semiconductor layer, so that the light emitting elements including the pn connection is formed in the thin layer of the compound semiconductor.

Fifth Embodiment

Figure 14:
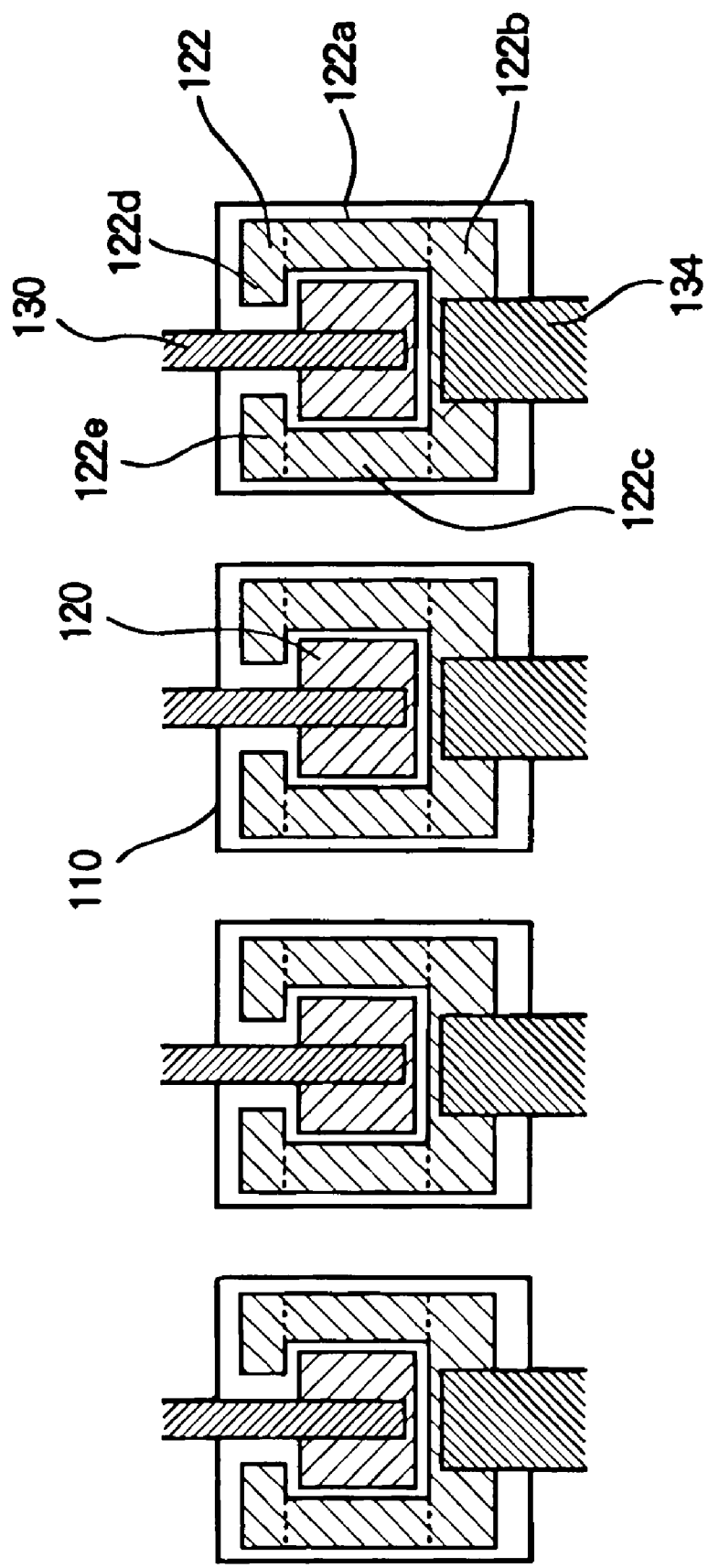
FIG. 14 is a schematic plan view showing a semiconductor device according to a fifth embodiment of the present invention.

A fifth embodiment of the present invention will be explained next. FIG. 14 is a schematic plan view showing a semiconductor device according to the fifth embodiment of the present invention. Components in the fifth embodiment similar to the components in the first to fourth embodiments are designated with the same reference numerals, and explanations thereof are omitted.

In the fifth embodiment, different from the third embodiment shown in FIG. 10, each of the first conductive type side electrodes 122 is formed in an area outside four sides of each of the light emitting areas 120 except an area overlapping the second conductive electrode 130 and the wiring pattern 136. In particular, each of the first conductive type side electrodes 122 includes electrode portions 122a to 122e.

Accordingly, in the embodiment, the first conductive type side electrodes 122 surround the four sides of the light emitting areas 120 except the areas overlapping the second conductive type side electrodes 130 and the wiring patterns 136.

Sixth Embodiment

Figure 15:
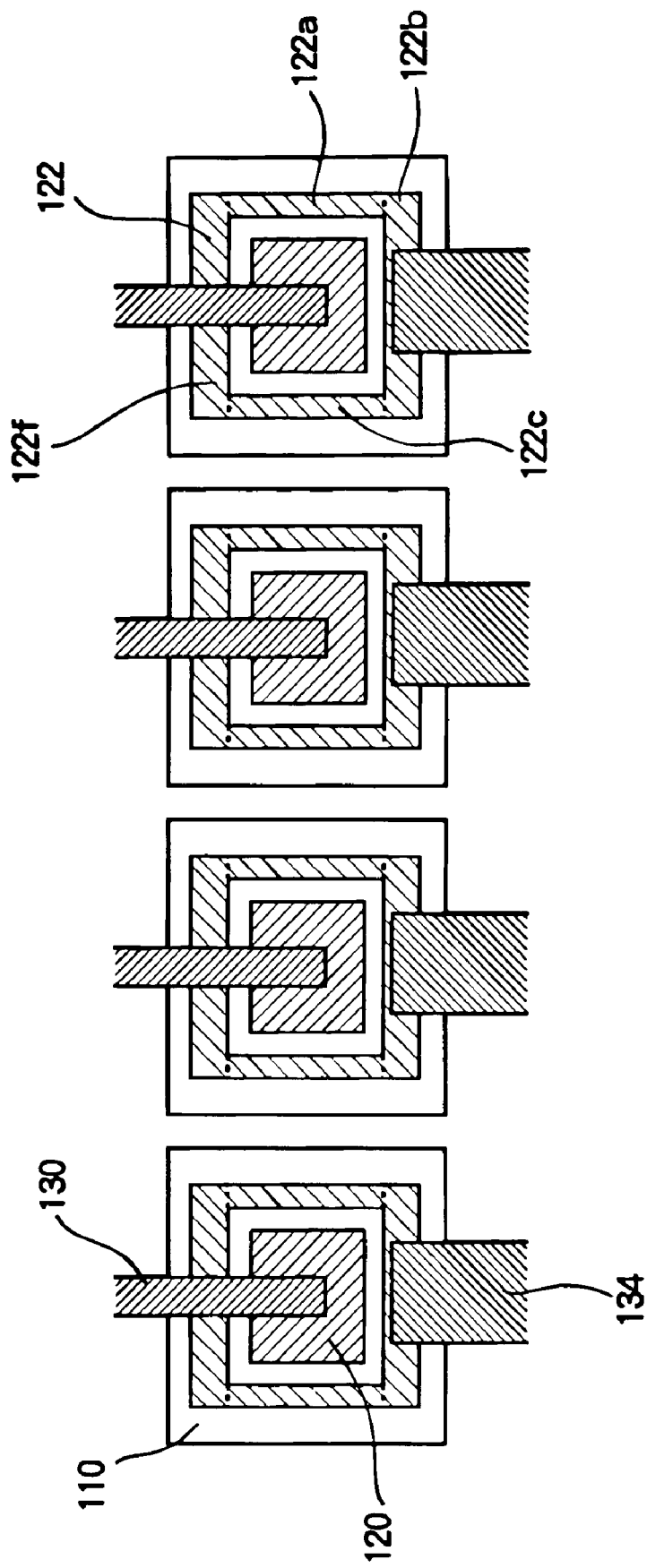
FIG. 15 is a schematic plan view showing a semiconductor device according to a sixth embodiment of the present invention.

A sixth embodiment of the present invention will be explained next. FIG. 15 is a schematic plan view showing a semiconductor device according to the sixth embodiment of the present invention. Components in the sixth embodiment similar to the components in the first to fifth embodiments are designated with the same reference numerals, and explanations thereof are omitted.

In the sixth embodiment, different from the third embodiment shown in FIG. 10 and the fifth embodiment shown in FIG. 14, each of the first conductive type side electrodes 122 is formed in an area outside the four sides of the light emitting areas 120 including the area overlapping the second conductive electrode 130 and the wiring pattern 136. In particular, each of the first conductive type side electrodes 122 includes the electrode portions 122a to 122e.

Accordingly, in the embodiment, the first conductive type side electrodes 122 surround the four sides of the rectangular shapes of the light emitting areas 120 including the areas overlapping the second conductive type side electrodes 130 and the wiring patterns 136 with the interlayer insulating layer 145 inbetween.

Seventh Embodiment

Figure 16:
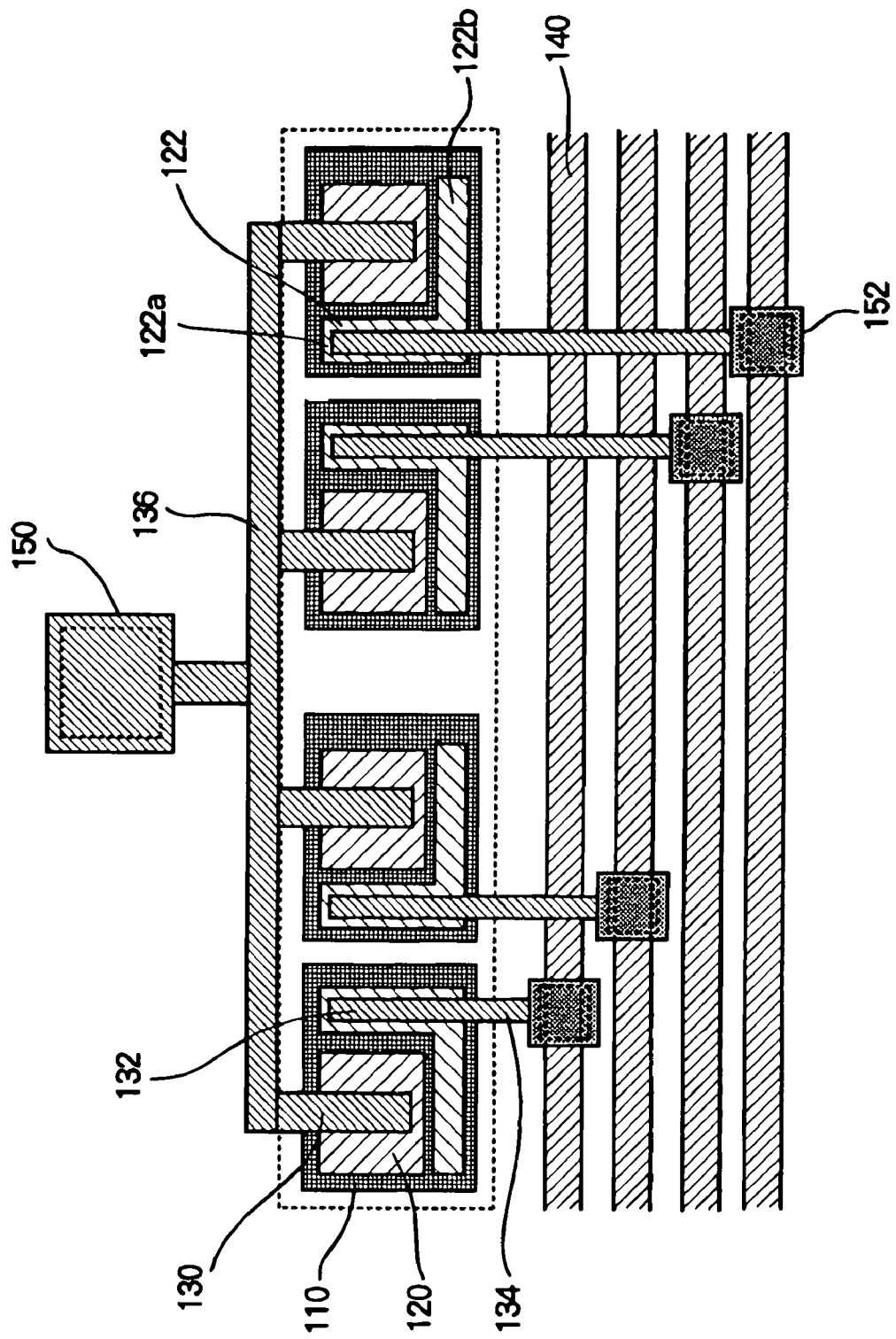
FIG. 16 is a schematic enlarged plan view showing a semiconductor device (LED array) according to a seventh embodiment of the present invention.

A seventh embodiment of the present invention will be explained next. FIG. 16 is a schematic enlarged plan view showing a semiconductor device (LED array) according to the seventh embodiment of the present invention. Components in the seventh embodiment similar to the components in the first to sixth embodiments are designated with the same reference numerals, and explanations thereof are omitted.

In the seventh embodiment, different from the first to sixth embodiments, two of the first conductive type side electrodes 122 are formed in an area between two of the light emitting areas 120 in the direction that the light emitting areas 120 are arranged.

In particular, two of the first conductive type side electrodes 122 are formed in an area between every two of the light emitting areas 120, and the two of the first conductive type side electrodes 122 correspond to the two of the light emitting areas 120. Accordingly, an area without the first conductive type side electrodes 122 is formed between every two of the rectangular shapes of the light emitting areas 120.

Accordingly, as shown in FIG. 16, the first conductive type side electrodes 122 and the first conductive type side wiring patterns 132 and 134 are disposed between two of the light emitting areas 120, and are not disposed in side end areas of the block.

Figure 17:
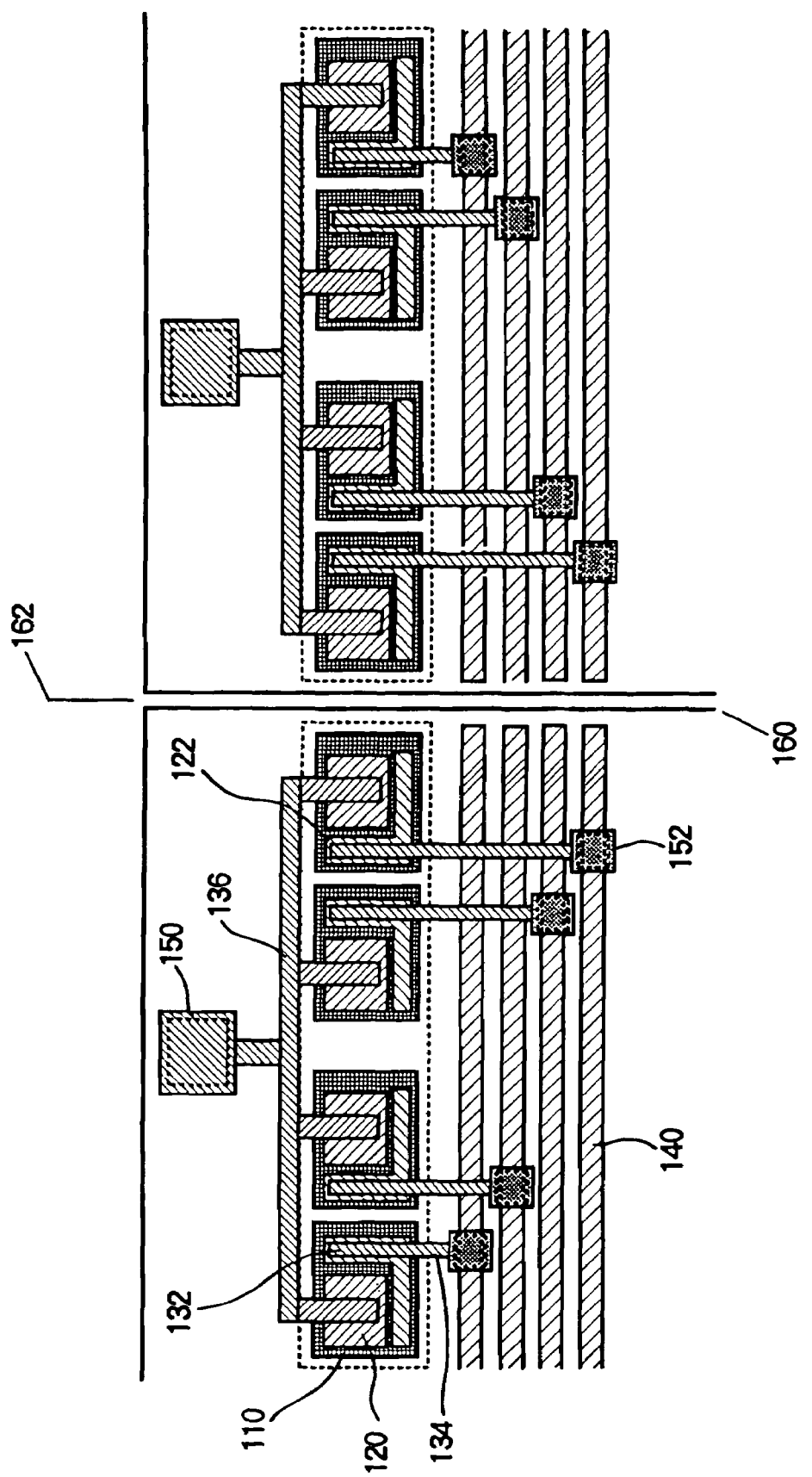
FIG. 17 is a schematic plan view showing the semiconductor devices shown in FIG. 16 and arranged next to with each other according to the seventh embodiment of the present invention.

FIG. 17 is a schematic plan view showing the semiconductor devices shown in FIG. 16 and arranged next to with each other according to the seventh embodiment of the present invention.

As shown in FIG. 17, the thin layer chips having the configuration shown in FIG. 16 are arranged such that edge portions 160 thereof face next to with each other with a space 162 inbetween. The first conductive type side electrodes 122 and the first conductive type side wiring patterns 132 and 134 are disposed between two of the light emitting areas 120, and are not disposed in side end areas of the block. That is, the first conductive type side electrodes 122 are disposed on sides of the light emitting areas 120 opposite to the edge portions 160 of the thin layer chips.

As described above, the first conductive type side electrodes 122 and the first conductive type side wiring patterns 132 and 134 are disposed on sides of the light emitting areas 120 opposite to the edge portions 160 of the light emitting elements. Accordingly, when the light emitting areas 120 are arranged apart from the edge portions 160 of the thin layer chips by a small distance, it is possible to make the distance substantially same as a pitch between the light emitting areas 120 inside the thin layer chips.

Eighth Embodiment

Figure 18:
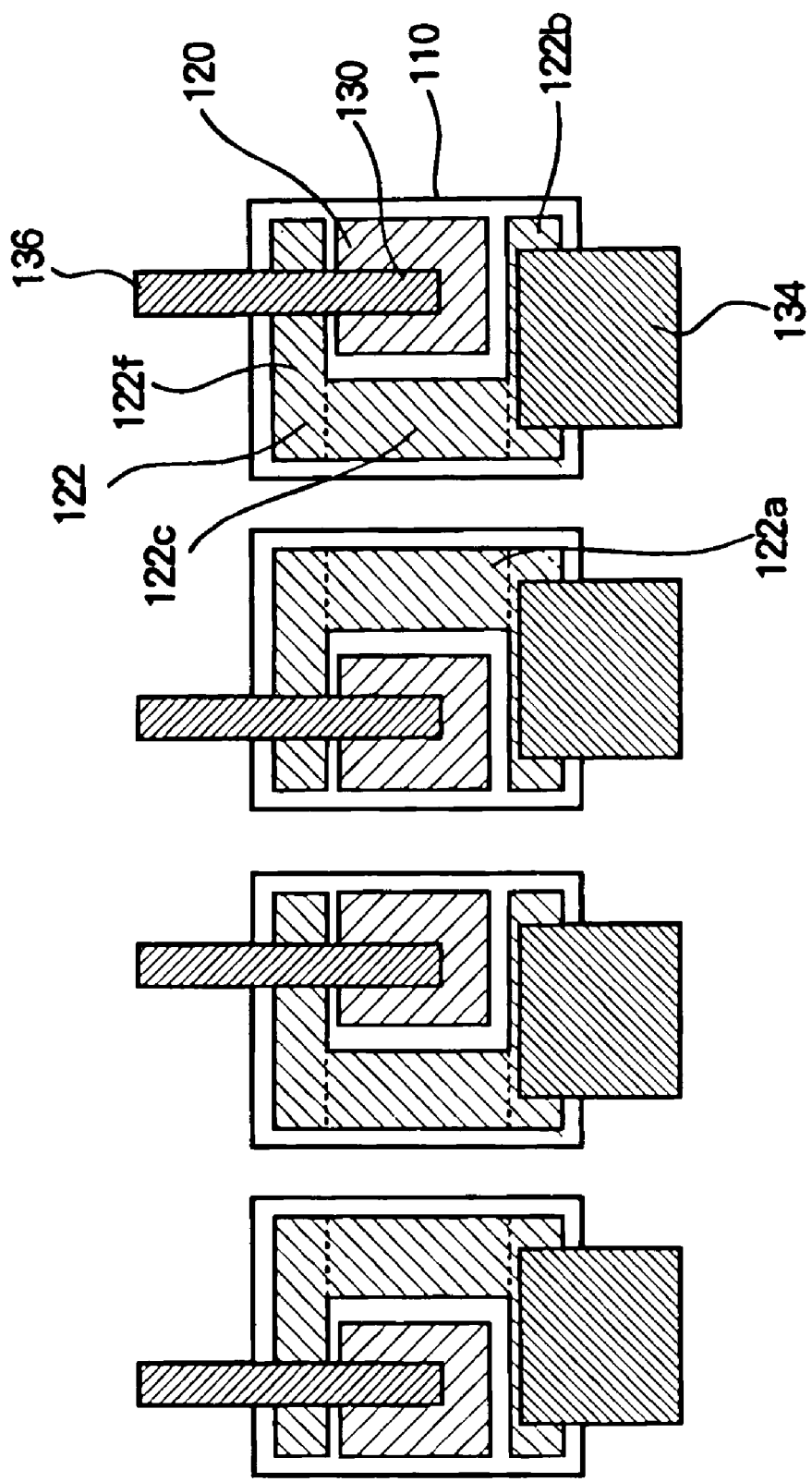
FIG. 18 is a schematic enlarged plan view showing a semiconductor device (LED array) according to an eighth embodiment of the present invention.

An eighth embodiment of the present invention will be explained next. FIG. 18 is a schematic enlarged plan view showing a semiconductor device (LED array) according to the eighth embodiment of the present invention. Components in the eighth embodiment similar to the components in the first to seventh embodiments are designated with the same reference numerals, and explanations thereof are omitted.

As shown in FIG. 18, each of the first conductive type side electrodes 122 is formed in an area surrounding outside the three sides of the light emitting areas 120, except the side between the first conductive type side electrodes 122 without an electrode. In particular, each of the first conductive type side electrodes 122 includes the electrode portions 122a to 122c.

Further, the first conductive type side electrodes 122 are disposed in the areas of the first conductive type side electrodes 122 crossing the second conductive type side electrodes 130 and the wiring patterns 136 with the interlayer insulating layer 145 inbetween.

Ninth Embodiment

Figure 19:
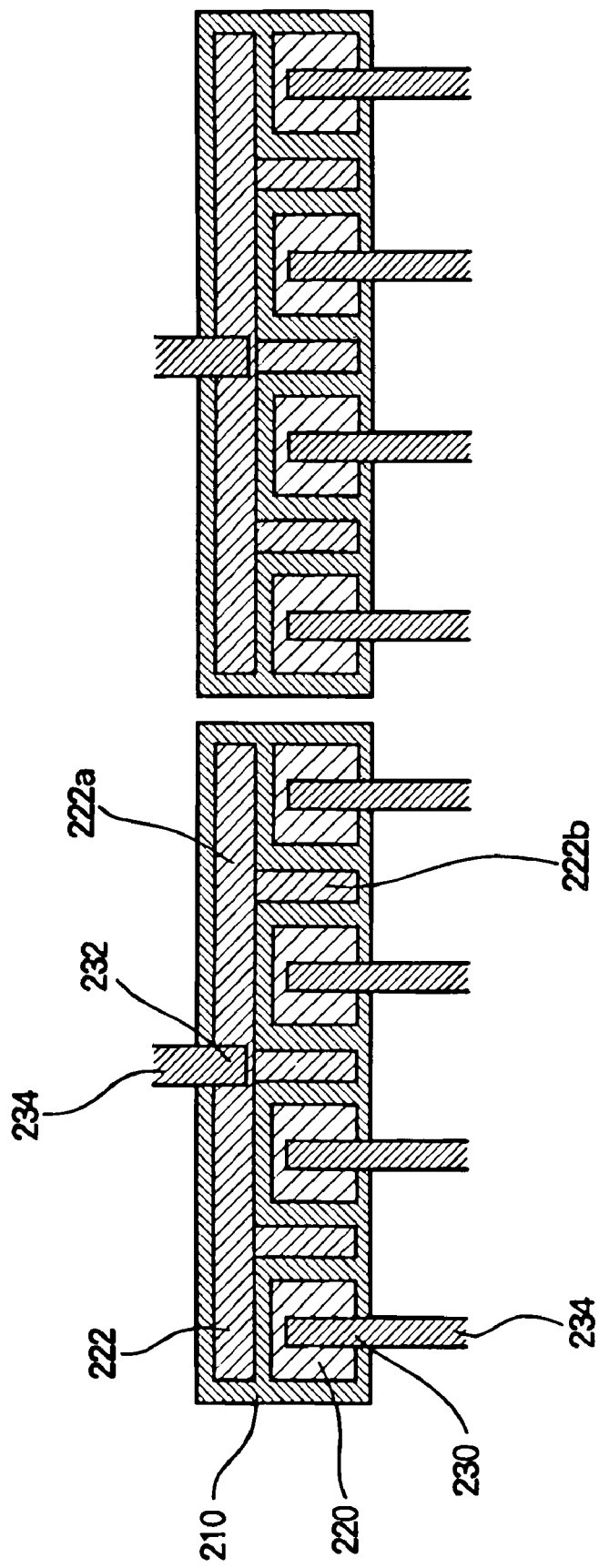
FIG. 19 is a schematic enlarged plan view showing a semiconductor device (LED array) according to a ninth embodiment of the present invention.

A ninth embodiment of the present invention will be explained next. FIG. 19 is a schematic enlarged plan view showing a semiconductor device (LED array) according to the ninth embodiment of the present invention. Components in the ninth embodiment similar to the components in the first to eighth embodiments are designated with the same reference numerals, and explanations thereof are omitted.

In the ninth embodiment, different from the first to eighth embodiments, a plurality of light emitting areas 220 is disposed on one single semiconductor thin layer 210. Electrode portions 222b of first conductive type side electrodes 222 are formed in areas between the light emitting areas 220 in the direction that the light emitting areas 220 are arranged. Electrode portions 222a of the first conductive type side electrodes 222 are formed in areas outside the light emitting areas 220 in the direction perpendicular to the direction that the light emitting areas 220 are arranged.

As shown in FIG. 19, different from the semiconductor thin layers 110 in the first embodiment, a plurality of the light emitting areas 220 is disposed on one single semiconductor thin layer 210. Different from the first conductive type side electrodes 122 in the first embodiment, the electrode portions 222a of the first conductive type side electrodes 222 are provided for the light emitting areas 220 in a same block.

As shown in FIG. 19, similar to the second conductive type side electrode 130 in the first embodiment, the second conductive type side electrodes 230 are provided. Different from the first conductive type side wiring patterns 132 and 134 in the first embodiment, first conductive type side wiring patterns 232 and 234 are connected to the first conductive type side electrodes 222 for the light emitting areas 220 in a same block. Similar to the second conductive type side wiring patterns 136 in the first embodiment, second conductive type side wiring patterns 236 are provided.

As described above, a plurality of the light emitting areas 220 is disposed on one single semiconductor thin layer 210. The first conductive type side electrodes 222 are formed in the areas between the light emitting areas 220 in the direction that the light emitting areas 220 are arranged, and in the areas outside the light emitting areas 220 in the direction perpendicular to the direction that the light emitting areas 120 are arranged. Accordingly, it is possible to reduce contact resistance of the first conductive type side electrodes 222, thereby reducing a drive voltage of the light emitting element. Further, it is possible to disposed the first conductive type side electrodes 222 in a stable state. Still further, it is possible to increase a bottom area of the semiconductor thin layers, thereby increasing a bonding strength relative to the flattening layer and improving reliability of the element.

Tenth Embodiment

Figure 20:
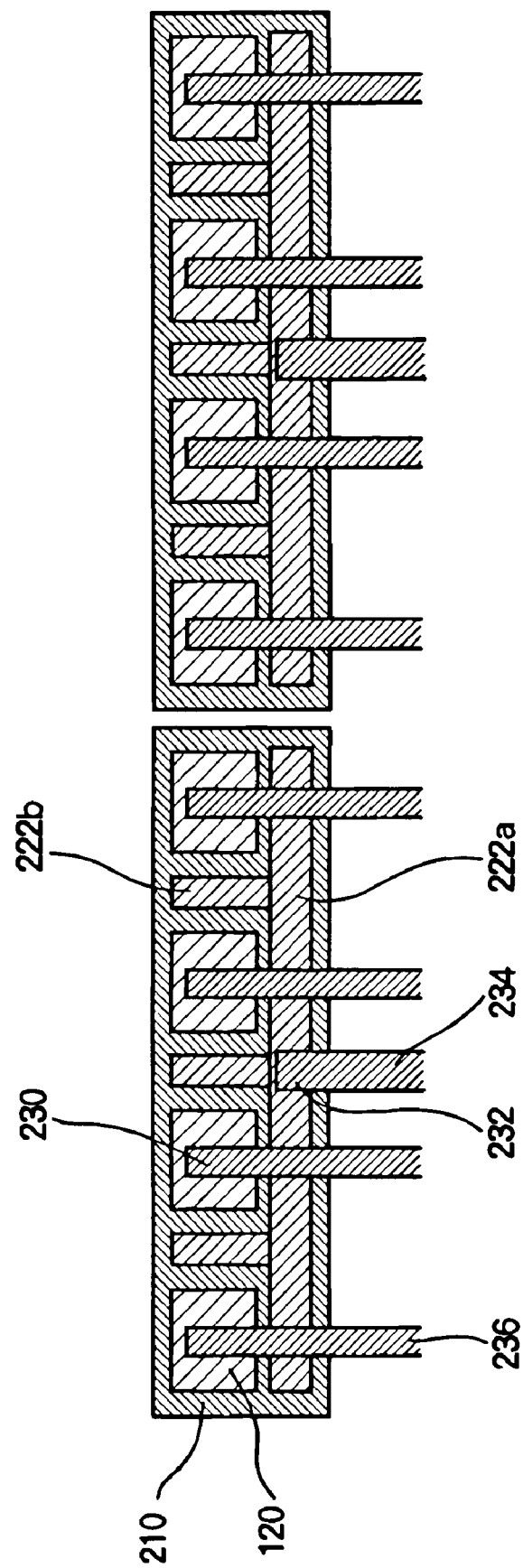
FIG. 20 is a schematic enlarged plan view showing a semiconductor device according to a tenth embodiment of the present invention.

A tenth embodiment of the present invention will be explained next. FIG. 20 is a schematic enlarged plan view showing a semiconductor device according to the tenth embodiment of the present invention. Components in the tenth embodiment similar to the components in the first to ninth embodiments are designated with the same reference numerals, and explanations thereof are omitted.

As shown in FIG. 20, the first conductive type side electrodes 222 may be disposed in areas opposite to the electrode portions 222a shown in FIG. 19 with the light emitting areas 220 inbetween (outside sides of the light emitting areas 220 opposite to the sides of the electrode portions 222a). In this case, the first conductive type side electrodes 222 are disposed with the interlayer insulating layer 145 inbetween outside the sides of the light emitting areas 220 crossing the second conductive type side electrodes 230 and the wiring patterns 236.

Eleventh Embodiment

Figure 21:
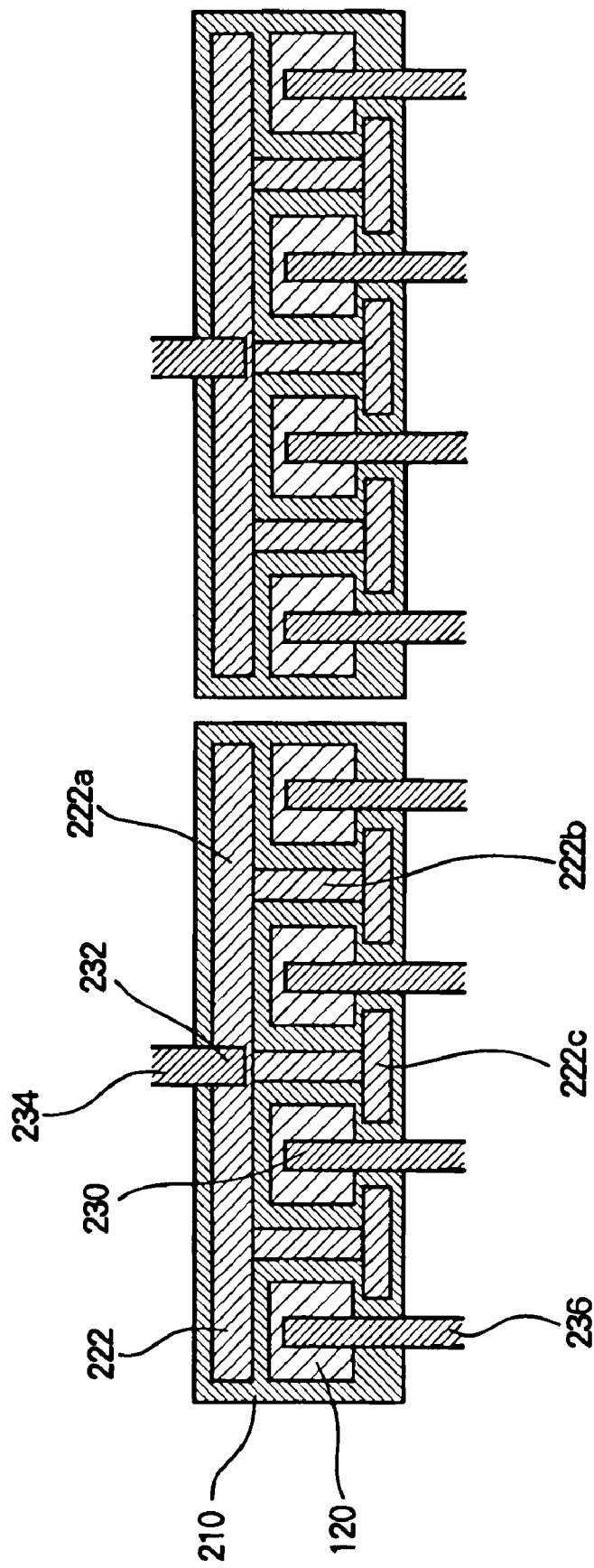
FIG. 21 is a schematic enlarged plan view showing a semiconductor device according to an eleventh embodiment of the present invention.

An eleventh embodiment of the present invention will be explained next. FIG. 21 is a schematic enlarged plan view showing a semiconductor device according to the eleventh embodiment of the present invention. Components in the eleventh embodiment similar to the components in the first to tenth embodiments are designated with the same reference numerals, and explanations thereof are omitted.

As shown in FIG. 21, different from the first conductive type side electrodes 222 shown in FIG. 19, the first conductive type side electrodes 222 have the electrode portions 220c extending from the electrode portions 220b in areas outside sides of the light emitting areas 120 not overlapping with the second conductive type side electrodes 230 and the wiring patterns 236 (areas without the second conductive type side electrodes 230 and the wiring patterns 236).

Accordingly, the first conductive type side electrodes 222 continuously surround four sides of the rectangular shape of the light emitting areas 120 except the second conductive type side wiring patterns. Further, the first conductive type side electrodes 222 do not have the electrode portions 220b in areas outside sides of the light emitting areas 120 at end portions of a block in the direction that the light emitting areas 120 are arranged in each of the block in the thin layer chip formed of the compound semiconductor in which a plurality of the light emitting areas 120 is disposed.

Still further, the first conductive type side electrodes 222 have the electrode portions 220c extending from the electrode portions 220b between the light emitting areas 120, and the electrode portions 220c surround outside the sides of the light emitting areas 120 opposite to the first conductive type side electrodes 222.

Twelfth Embodiment

Figure 22:
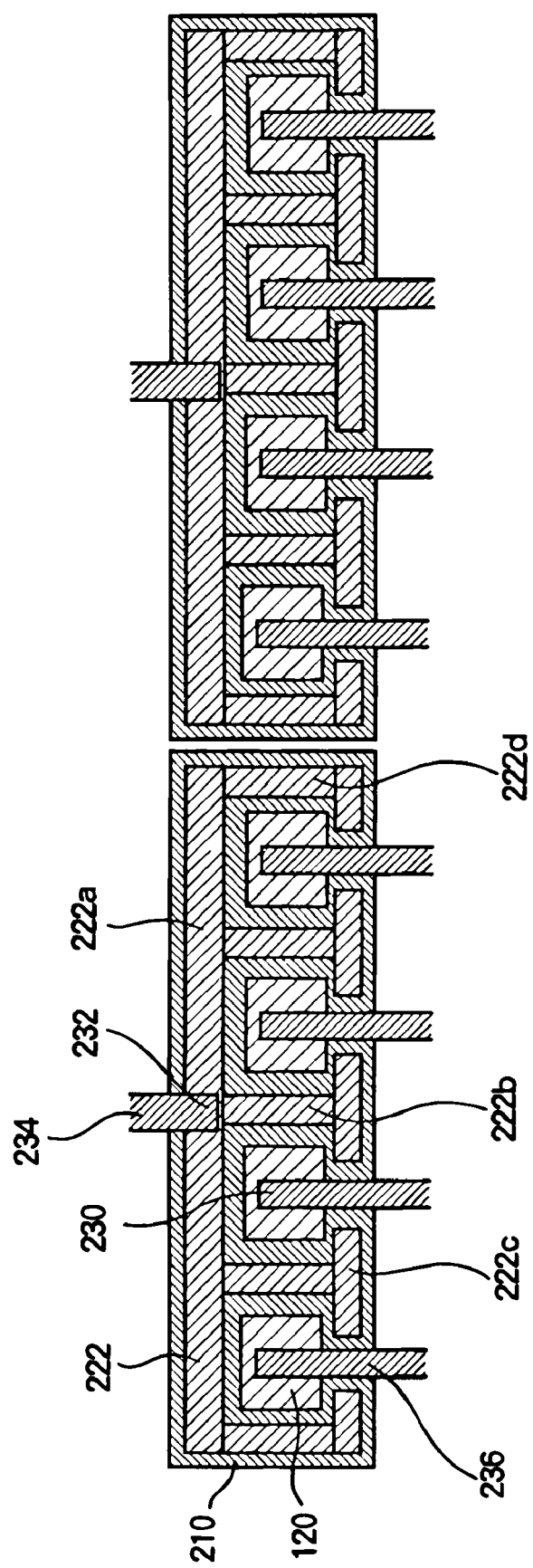
FIG. 22 is a schematic enlarged plan view showing a semiconductor device according to a twelfth embodiment of the present invention.

A twelfth embodiment of the present invention will be explained next. FIG. 22 is a schematic enlarged plan view showing a semiconductor device according to the twelfth embodiment of the present invention. Components in the twelfth embodiment similar to the components in the first to eleventh embodiments are designated with the same reference numerals, and explanations thereof are omitted.

As shown in FIG. 22, different from the first conductive type side electrodes 222 shown in FIGS. 19 and 21, the first conductive type side electrodes 222 have electrode portions 220d in areas outside sides of the light emitting areas 120 at end portions of a block in the direction that the light emitting areas 120 are arranged in each of the block in the thin layer chip formed of the compound semiconductor in which a plurality of the light emitting areas 120 is disposed. Further, the electrode portions 220c extend from the electrode portions 220d.

Thirteenth Embodiment

Figure 23:
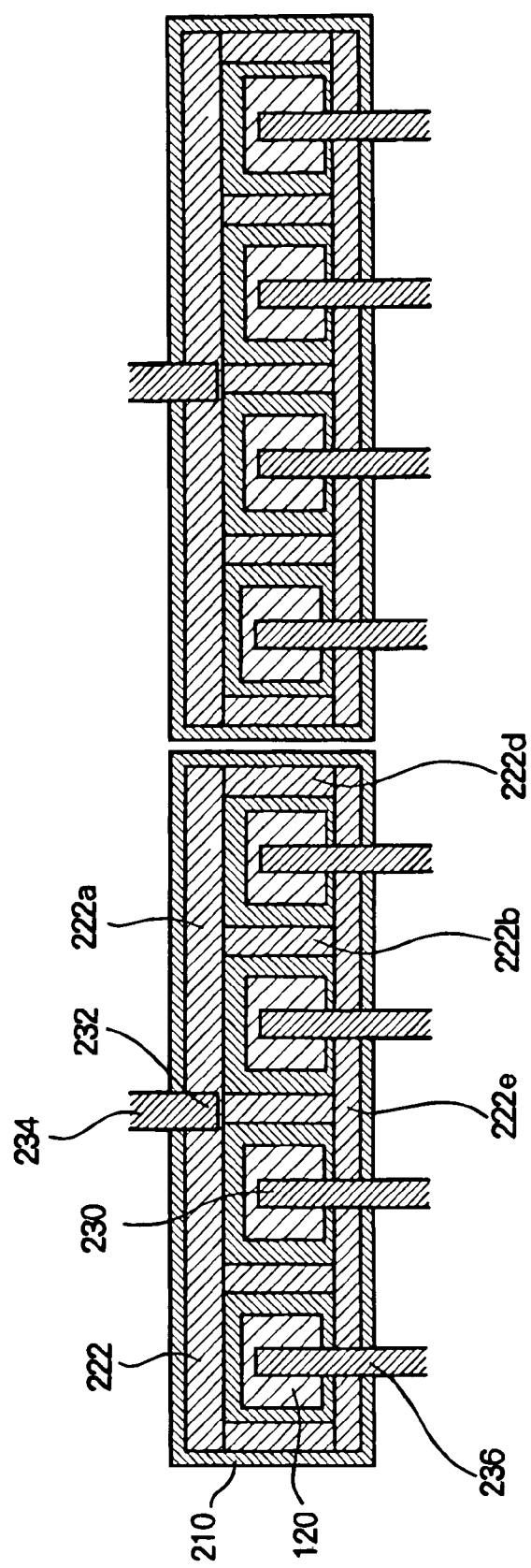
FIG. 23 is a schematic enlarged plan view showing a semiconductor device according to a thirteenth embodiment of the present invention.

A thirteenth embodiment of the present invention will be explained next. FIG. 23 is a schematic enlarged plan view showing a semiconductor device according to the thirteenth embodiment of the present invention. Components in the thirteenth embodiment similar to the components in the first to twelfth embodiments are designated with the same reference numerals, and explanations thereof are omitted.

As shown in FIG. 23, different from the first conductive type side electrodes 222 shown in FIG. 22, the first conductive type side electrodes 222 have electrode portions 220e extending from the electrode portions 220d in areas outside sides of the light emitting areas 120 overlapping with the second conductive type side electrodes 230 and the wiring patterns 236, or over the second conductive type side electrodes 230 and the wiring patterns 236.

Accordingly, in the embodiment, the first conductive type side electrodes 222 continuously surround four sides of the rectangular shape of the light emitting areas 120, and are disposed with the interlayer insulating layer 145 inbetween in areas outside the sides of the light emitting areas 120 crossing with the second conductive type side electrodes 230 and the wiring patterns 236.

Fourteenth Embodiment

Figure 24:
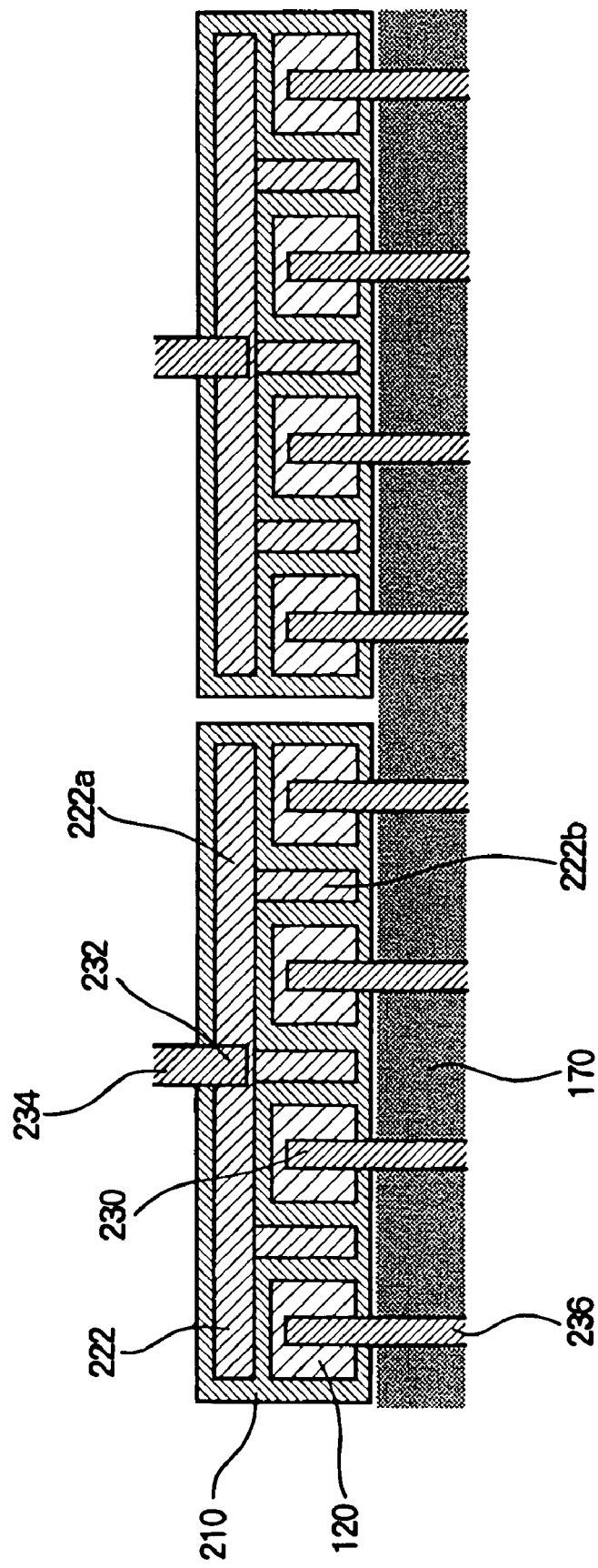
FIG. 24 is a schematic enlarged plan view showing a semiconductor device according to a fourteenth embodiment of the present invention.

A fourteenth embodiment of the present invention will be explained next. FIG. 24 is a schematic enlarged plan view showing a semiconductor device according to a fourteenth embodiment of the present invention. Components in the fourteenth embodiment similar to the components in the first to thirteenth embodiments are designated with the same reference numerals, and explanations thereof are omitted.

As shown in FIG. 24, the second embodiment is provided with the light blocking layer 170 in an area without the light emitting areas 120, the first conductive type side electrodes 222 and the second conductive type side electrodes 230 for blocking light from outside. The light blocking layer 170 has edge portions close to the light emitting areas 120. Accordingly, it is possible to reduce an influence of external light or reflection light in the LED print head.

Figure 25:
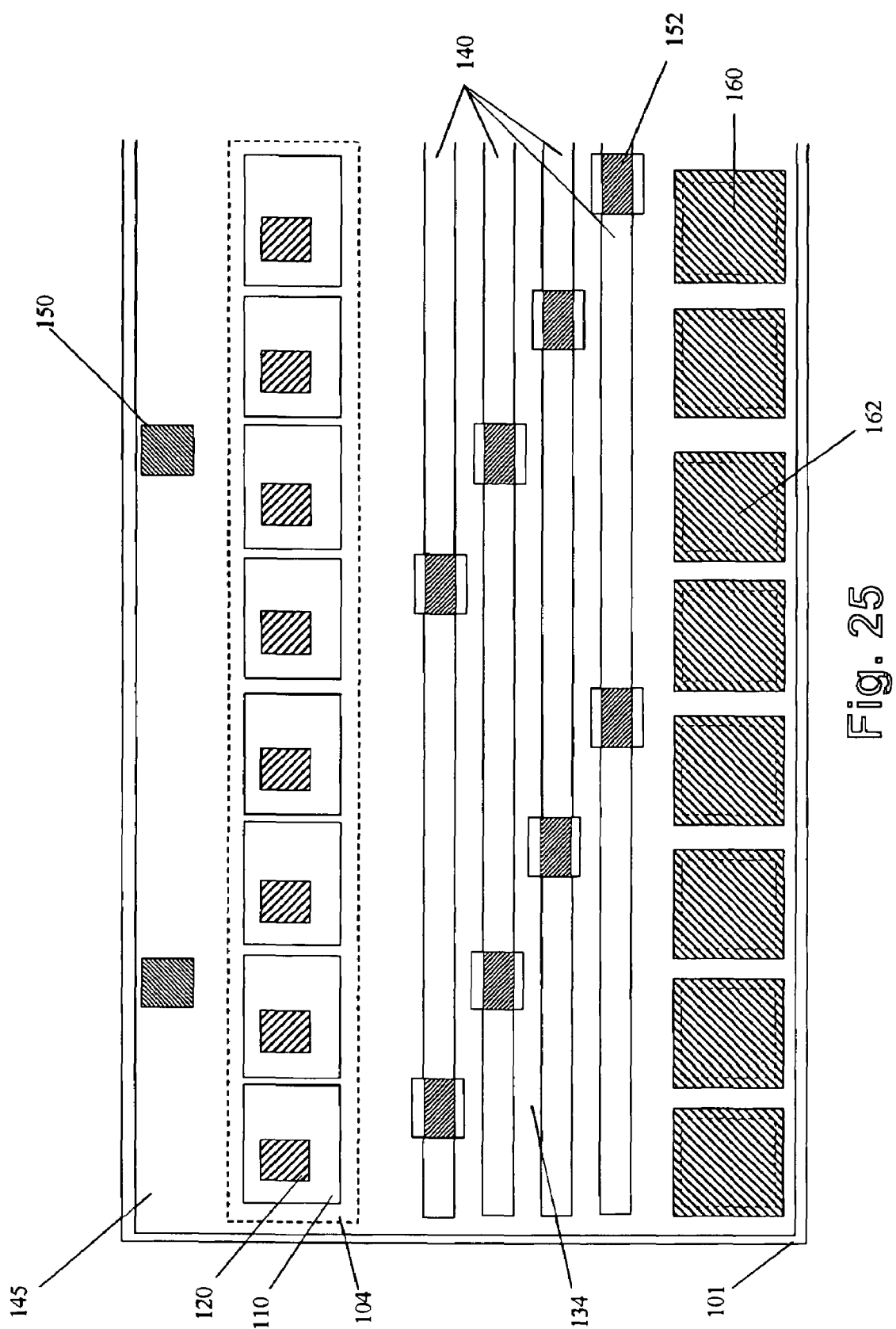
FIG. 25 is a schematic view No. 1 showing a process of producing the semiconductor device.
Figure 26:
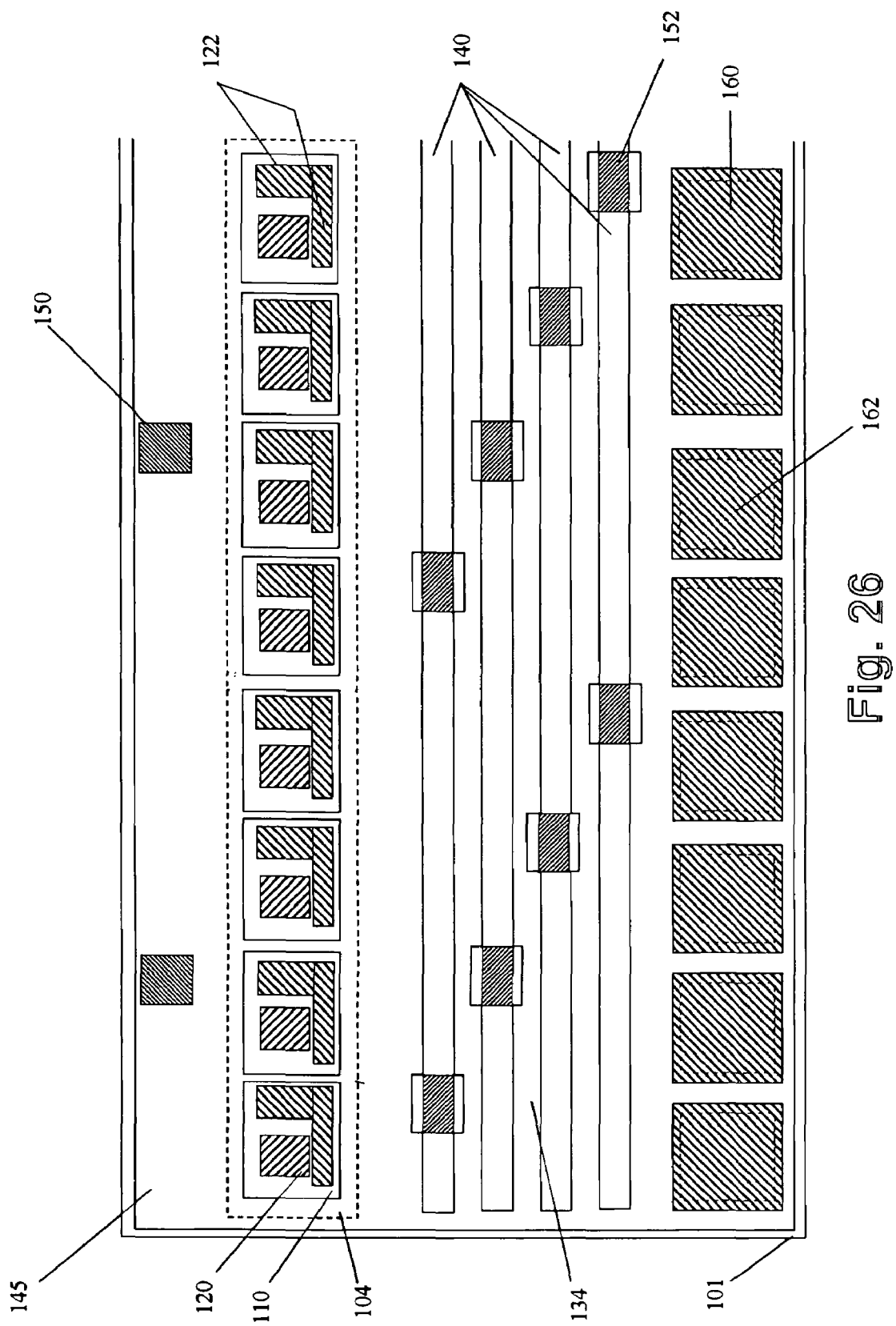
FIG. 26 is a schematic view No. 2 showing the process of producing the semiconductor device.
Figure 27:
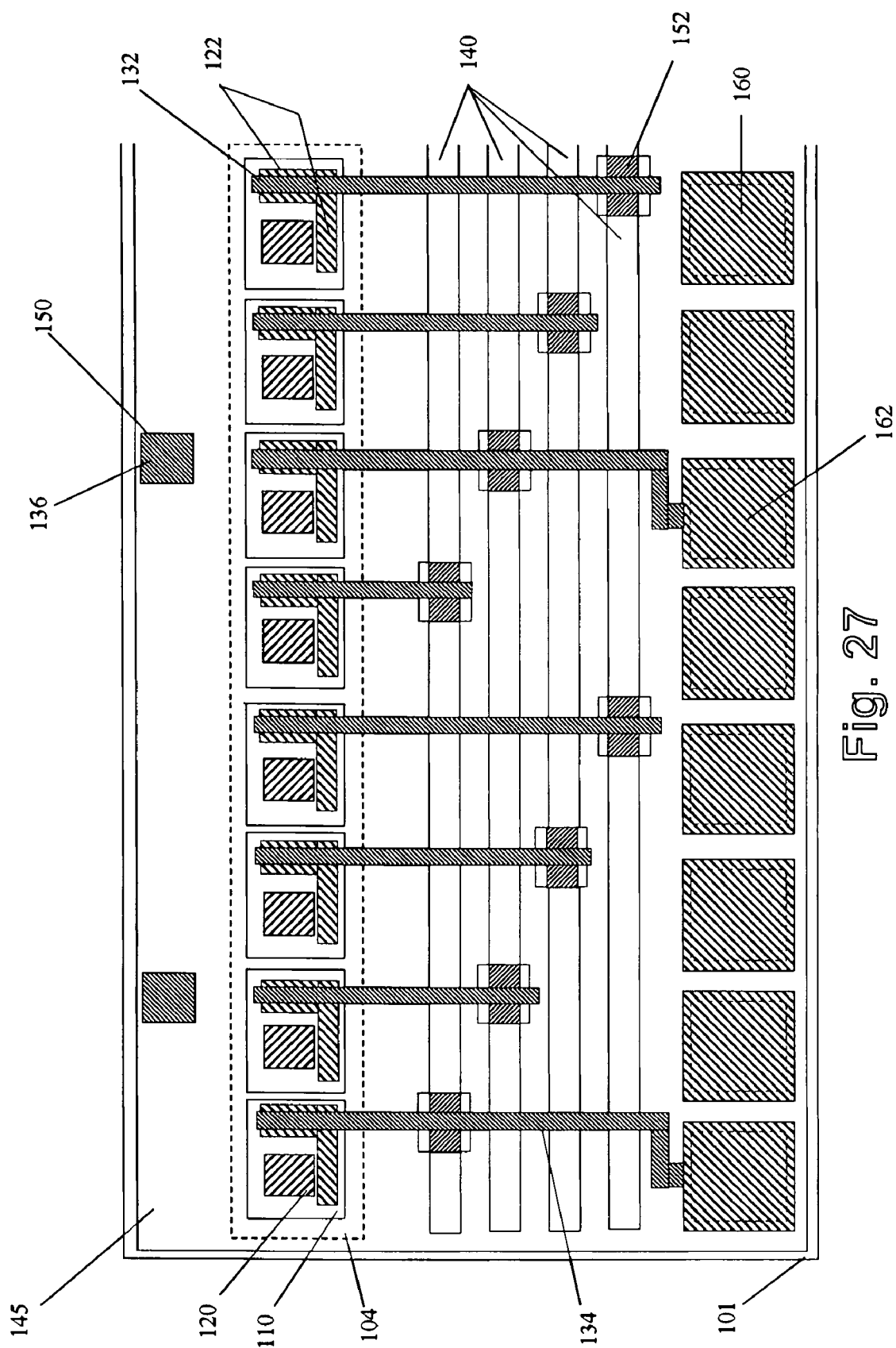
FIG. 27 is a schematic view No. 3 showing the process of producing the semiconductor device.
Figure 28:
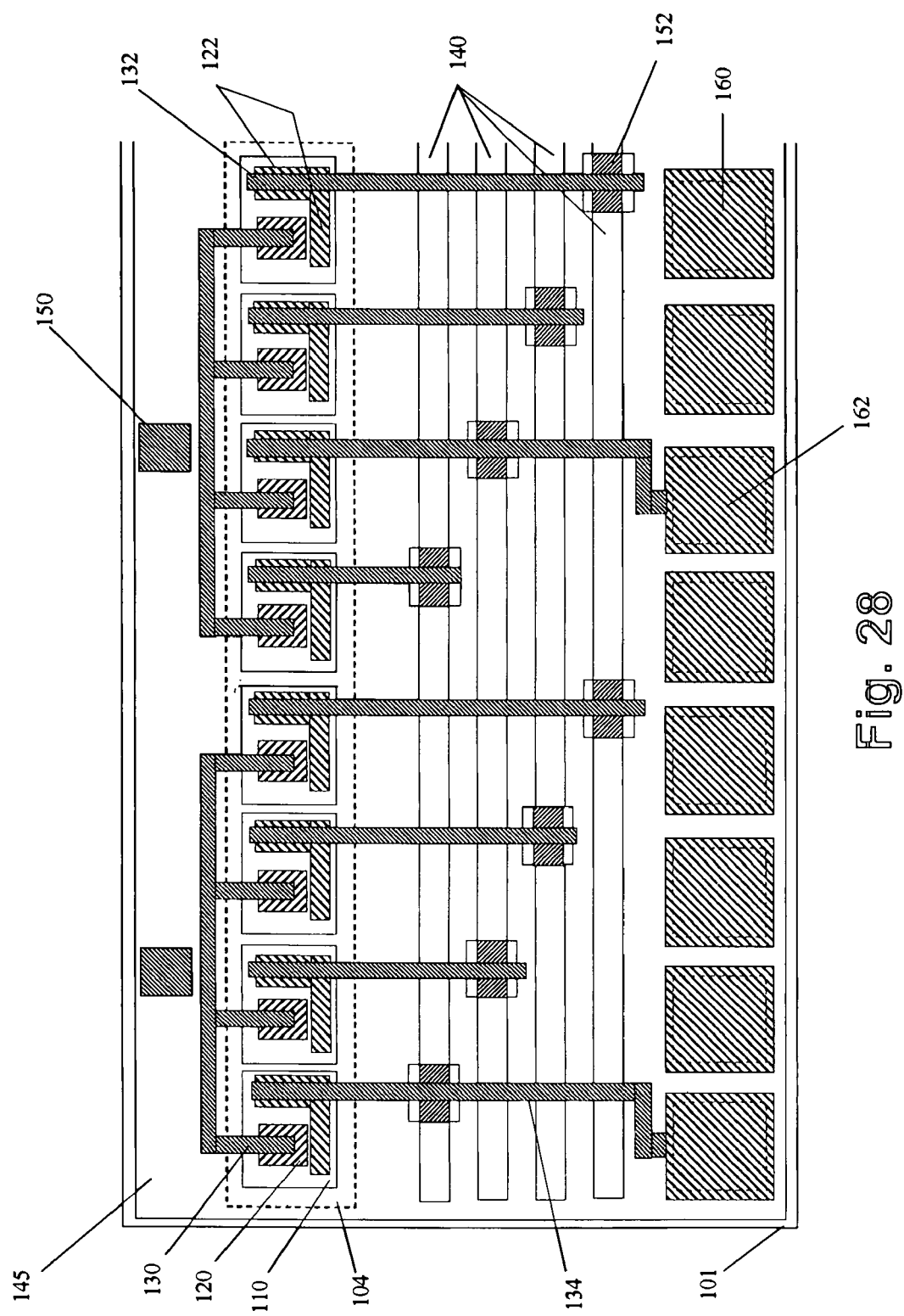
FIG. 28 is a schematic view No. 4 showing the process of producing the semiconductor device.
Figure 29:
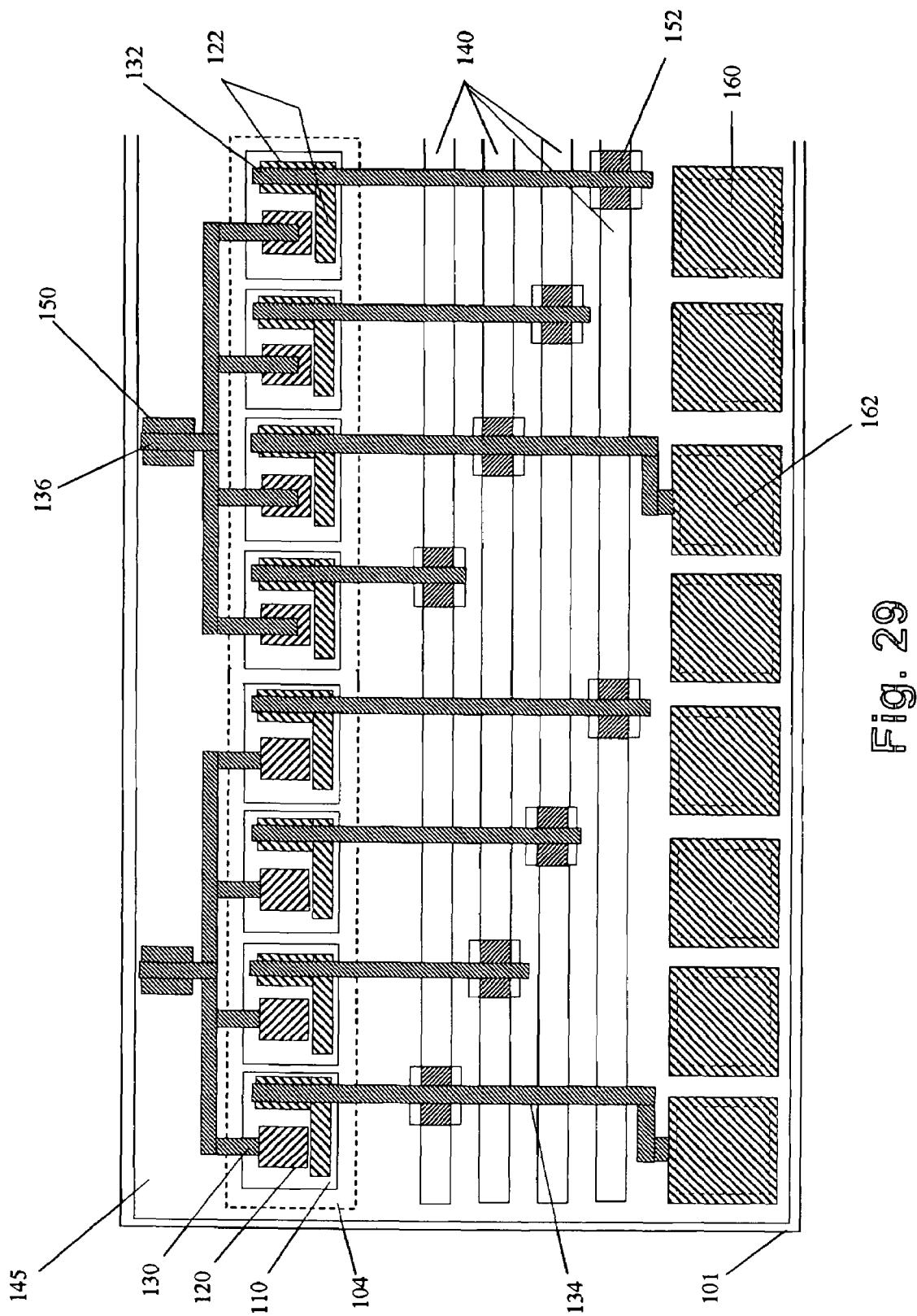
FIG. 29 is a schematic view No. 5 showing the process of producing the semiconductor device.

A process of producing the semiconductor device will be explained next. FIG. 25 is a schematic view No. 1 showing a process of producing the semiconductor device. FIG. 26 is a schematic view No. 2 showing the process of producing the semiconductor device. FIG. 27 is a schematic view No. 3 showing the process of producing the semiconductor device. FIG. 28 is a schematic view No. 4 showing the process of producing the semiconductor device. FIG. 29 is a schematic view No. 5 showing the process of producing the semiconductor device.

As shown in FIG. 25, first, the reflection layer 104 and the flattening layer 105 are formed on the drive circuits. Then, through an etching process, the semiconductor thin layers 110 and the light emitting areas 120 are formed.

In the next step, as shown in FIG. 26, the first conductive type side electrodes 122 are formed. Then, as shown in FIG. 27, the first conductive type side wiring patterns 132 are formed.

In the next step, as shown in FIG. 28, the second conductive type side electrodes 130 are formed. In the last step, as shown in FIG. 29, the wiring patterns 136 are formed.

As described above, in the semiconductor device, the light emitting elements (LEDs) are formed in the semiconductor thin layers as the semiconductor elements. Instead of the light emitting elements, light receiving elements or other semiconductor elements may be formed.

The disclosure of Japanese Patent Application No. 2006-235559, filed on Aug. 31, 2006, is incorporated in the application by reference.

While the invention has been explained with reference to the specific embodiments of the invention, the explanation is illustrative and the invention is limited only by the appended claims.

What is claimed is:

1. A semiconductor device comprising:
   a plurality of light emitting elements formed of a thin layer of a compound semiconductor and arranged in a row in one direction with an equal interval therebetween,
   wherein each of said light emitting elements includes:
   a light emitting area formed on a first surface of the light emitting element;
   a first conductive type side electrode formed on the first surface and electrically connected to one side of the light emitting element, said first conductive type side electrode being disposed at a position continuously surrounding at lease two sides of the light emitting area in a first direction that the light emitting elements are arranged and a second direction perpendicular to the first direction; and
   a second conductive type side electrode formed on the first surface and electrically connected to the other side of the light emitting element, said second conductive type side electrode being disposed on the light emitting area.

2. The semiconductor device according to claim 1, wherein at least one of two of said first conductive type side electrodes corresponding to two adjacent ones of the light emitting elements includes an electrode portion in an area between the two adjacent ones of the light emitting elements.

3. The semiconductor device according to claim 1, wherein said first conductive type side electrode is disposed in an area continuously surrounding three sides of the light emitting area.

4. The semiconductor device according to claim 1, wherein said first conductive type side electrode is disposed in an area outside three sides of the light emitting area except one side of the light emitting area crossing a wiring pattern of the second conductive type side.

5. The semiconductor device according to claim 1, wherein said first conductive type side electrode is disposed in an area continuously surrounding four sides of the light emitting area.

6. The semiconductor device according to claim 5, wherein said first conductive type side electrode is disposed in the area including a wiring pattern of the second conductive type side with an interlayer insulating layer inbetween.

7. The semiconductor device according to claim 1, wherein two of said first conductive type side electrodes corresponding to two adjacent ones of the light emitting elements include electrode portions in an area between the two adjacent ones of the light emitting elements, said area being arranged every two of the light emitting elements.

8. The semiconductor device according to claim 1, wherein said second conductive type side electrodes include a plurality of electrode portions per one block in which a specific number of the light emitting areas are disposed, said electrode portions being electrically connected to each other in the first direction to form one electrode.

9. The semiconductor device according to claim 1, wherein said first conductive type side electrode includes a common electrode portion between two adjacent ones of the light emitting areas for corresponding to the two adjacent ones in one block in which a specific number of the light emitting areas arranged.

10. The semiconductor device according to claim 1, wherein said first conductive type side electrodes include a plurality of first electrode portions and a plurality of second electrode portions per one block in which a specific number of the light emitting areas are disposed, said first electrode portions being disposed between the light emitting areas, said second electrode portions being electrically connected to each other in the first direction to form one electrode.

11. The semiconductor device according to claim 10, wherein said one electrode is disposed with an interlayer insulating layer inbetween on a side of the light emitting area crossing a wiring pattern of the second conductive type side electrode.

12. The semiconductor device according to claim 10, wherein said first conductive type side electrode includes a electrode portion surrounding from one side of the light emitting area to the opposite side of the light emitting area.

13. The semiconductor device according to claim 10, wherein said first conductive type side electrode includes a electrode portion disposed except outside the light emitting areas arranged at both sides of the one block.

14. The semiconductor device according to claim 10, wherein said first conductive type side electrode includes a electrode portion disposed including outside the light emitting areas arranged at both sides of the one block.

15. The semiconductor device according to claim 10, wherein said first conductive type side electrode is disposed with an interlayer insulating layer inbetween outside of a side of the light emitting area crossing a wiring pattern of the second conductive type side electrode.

16. The semiconductor device according to claim 1, further comprising a light blocking layer formed on the first surface in an area where the light emitting elements, the first conductive type side electrodes, and the second conductive type side electrodes are not disposed.

17. A light emitting diode print head comprising the semiconductor device according to claim 1; a drive circuit for selectively driving the light emitting elements; and a holding member for holding the semiconductor device and the drive circuit, said light emitting elements being formed of light emitting diodes.

18. An image forming apparatus comprising a photosensitive member; a charging device for charging a surface of the photosensitive member; the light emitting diode print head according to claim 17 for selectively exposing the surface of the photosensitive member to form a static latent image; and a developing device for developing the static latent image.

* * * * *